United States Patent
Rodnick

(10) Patent No.: US 9,434,071 B2
(45) Date of Patent: Sep. 6, 2016

(54) WAFER HANDLING TRACTION CONTROL SYSTEM

(71) Applicant: Lam Research Corporation, Fremont, CA (US)

(72) Inventor: Matthew J. Rodnick, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/864,713

(22) Filed: Sep. 24, 2015

(65) Prior Publication Data

US 2016/0023353 A1    Jan. 28, 2016

Related U.S. Application Data

(63) Continuation of application No. 14/166,771, filed on Jan. 28, 2014, now Pat. No. 9,184,084.

(51) Int. Cl.
| | |
|---|---|
| *G06F 7/00* | (2006.01) |
| *G06F 19/00* | (2011.01) |
| *B25J 9/16* | (2006.01) |
| *H01L 21/687* | (2006.01) |
| *H01L 21/67* | (2006.01) |
| *H01L 21/66* | (2006.01) |
| *B25J 13/08* | (2006.01) |
| *B25J 11/00* | (2006.01) |

(52) U.S. Cl.
CPC ............ *B25J 9/1612* (2013.01); *B25J 9/1656* (2013.01); *B25J 9/1694* (2013.01); *B25J 13/083* (2013.01); *H01L 21/67259* (2013.01); *H01L 21/68707* (2013.01); *H01L 22/26* (2013.01); *B25J 11/0095* (2013.01); *G05B 2219/39057* (2013.01); *G05B 2219/40567* (2013.01); *G05B 2219/45031* (2013.01); *Y10S 901/09* (2013.01); *Y10S 901/47* (2013.01)

(58) Field of Classification Search
None
See application file for complete search history.

(56) References Cited

U.S. PATENT DOCUMENTS

| | | | |
|---|---|---|---|
| 5,980,194 A * | 11/1999 | Freerks | H01L 21/67259 318/640 |
| 6,113,165 A | 9/2000 | Wen et al. | |
| 6,631,935 B1 | 10/2003 | Casarotti et al. | |
| 9,184,084 B2 * | 11/2015 | Rodnick | H01L 21/68707 |

(Continued)

FOREIGN PATENT DOCUMENTS

CN    104810307    7/2015

OTHER PUBLICATIONS

US Notice of Allowance dated Jun. 24, 2015 issued in U.S. Appl. No. 14/166,771.

(Continued)

*Primary Examiner* — Yolanda Cumbess
(74) *Attorney, Agent, or Firm* — Weaver Austin Villeneuve & Sampson LLP

(57) ABSTRACT

A wafer handling traction control system is provided that is able to detect slippage of a semiconductor wafer with respect to an end effector and is able to adjust the end effector's movement in order to minimize further slippage. Upon the detection of relative motion of the semiconductor wafer with respect to the end effector past a threshold amount, the end effector's movements are adjusted to minimize slippage of the semiconductor wafer. The wafer handling traction control system may include a sensor that detects relative motion between the semiconductor wafer and the end effector.

20 Claims, 12 Drawing Sheets

(56) References Cited

U.S. PATENT DOCUMENTS

| | | | |
|---|---|---|---|
| 2003/0130759 A1* | 7/2003 | Kesil | B25J 9/1633 700/190 |
| 2005/0186063 A1 | 8/2005 | Rice et al. | |
| 2012/0101633 A1* | 4/2012 | Rodnick | B25J 9/1612 700/253 |
| 2013/0053997 A1* | 2/2013 | Ohashi | H01L 21/67742 700/103 |
| 2015/0214091 A1 | 7/2015 | Rodnick | |

OTHER PUBLICATIONS

US Notice of Allowance and Corrected Notice of Allowability dated Jul. 15, 2015 issued in U.S. Appl. No. 14/166,771.

US Notice of Allowance and Corrected Notice of Allowability dated Aug. 12, 2015 issued in U.S. Appl. No. 14/166,771.

* cited by examiner

WAFER HANDLING TRACTION CONTROL SYSTEM

CROSS REFERENCE TO RELATED APPLICATIONS

This application is a continuation of U.S. patent application Ser. No. 14/166,771, filed on Jan. 28, 2014, and titled "Wafer Handling Traction Control System."

BACKGROUND

Robot arms with end effectors are used to pick and place semiconductor wafers. The end effectors may typically be a "blade" type end effector, e.g., spatula-like. Many blade-type end effectors rely on gravity and friction to hold the semiconductor wafer in place and moving the end effector too quickly may cause the semiconductor wafer to slip off the end effector. One conventional approach is to utilize a sensor or sensors to detect when the semiconductor wafer is no longer on the end effector, e.g., the wafer has fallen off, and to stop the robot arm when such an event has occurred.

SUMMARY

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

In some implementations, an apparatus for use with semiconductor processing equipment may be provided. The apparatus may include a first robot arm configured to support a first semiconductor wafer on a first end effector, a first sensor configured to detect relative movement between the first semiconductor wafer and the first end effector, and a controller with one or more processors and a memory. The one or more processors, the memory, the first robotic arm, and the first sensor may be communicatively connected. The memory may store program instructions for controlling the one or more processors to: a) cause the first robot arm to move according to a first acceleration profile while the first semiconductor wafer is supported by the first end effector, b) receive first sensor data from the first sensor, c) analyze the first sensor data to determine first motion data based on relative movement of the first semiconductor wafer with respect to the first end effector during motion of the first robot arm while the first semiconductor wafer is supported by the first end effector, d) determine whether the first motion data attributable to movement of the first robot arm according to the first acceleration profile exceeds a first threshold motion metric, and e) cause the first robot arm to move according to a second acceleration profile when the first motion data attributable to movement of the first robot arm according to the first acceleration profile exceeds the first threshold motion metric. The first motion data attributable to movement of the first robot arm according to the second acceleration profile may stay within the first threshold motion metric.

In some such implementations of the apparatus, the first motion data may be based on data from which the relative acceleration of the first semiconductor wafer with respect to the first end effector during motion of the first robot arm while the first semiconductor wafer is supported by the first end effector can be calculated. In some such implementations, the first threshold motion metric may be relative acceleration of between about 0.001 and 100 $m^2/s$ of the first semiconductor wafer with respect to the first end effector during motion of the first robot arm while the first semiconductor wafer is supported by the first end effector. In some other or additional such implementations, the first threshold motion metric may be relative acceleration of between about 1 and 10 $m^2/s$ of the first semiconductor wafer with respect to the first end effector during motion of the first robot arm while the first semiconductor wafer is supported by the first end effector.

In some other or additional implementations of the apparatus, the first motion data may be based on data from which the relative velocity of the first semiconductor wafer with respect to the first end effector during motion of the first robot arm while the first semiconductor wafer is supported by the first end effector can be calculated. In some such implementations, the first threshold motion metric may be a relative velocity of between about 0.001 and 100 m/s of the first semiconductor wafer with respect to the first end effector during motion of the first robot arm while the first semiconductor wafer is supported by the first end effector. In some other or additional such implementations, the first threshold motion metric may be a relative velocity of between about 0.5 and 10 m/s of the first semiconductor wafer with respect to the first end effector during motion of the first robot arm while the first semiconductor wafer is supported by the first end effector.

In some other or additional implementations of the apparatus, the first motion data may be based on the relative displacement of the first semiconductor wafer with respect to the first end effector during motion of the first robot arm while the first semiconductor wafer is supported by the first end effector. In some such implementations, the first threshold motion metric may be a relative displacement of between about 0.001 and 100 mm of the first semiconductor wafer with respect to the first end effector during motion of the first robot arm while the first semiconductor wafer is supported by the first end effector. In some other or additional such implementations, the first threshold motion metric may be a relative displacement of between about 0.5 and 4 mm of the first semiconductor wafer with respect to the first end effector during motion of the first robot arm while the first semiconductor wafer is supported by the first end effector.

In some other or additional implementations of the apparatus, the first motion data may be based on a combination of two or more relative motion parameters selected from the group consisting of: relative acceleration (of the first semiconductor wafer with respect to the first end effector during motion of the first robot arm while the first semiconductor wafer is supported by the first end effector), relative velocity (of the first semiconductor wafer with respect to the first end effector during motion of the first robot arm while the first semiconductor wafer is supported by the first end effector), and relative displacement of the first semiconductor wafer with respect to the first end effector during motion of the first robot arm while the first semiconductor wafer is supported by the first end effector.

In some other or additional implementations, the apparatus may further include a wafer aligner configured to support the first semiconductor wafer and the memory may store further instructions for additionally controlling the one or more processors to cause the first robot arm to place the first semiconductor wafer on the wafer aligner to correct for relative displacement of the first semiconductor wafer with respect to the first end effector that occurred during a) and e).

In some other or additional implementations, the apparatus' first acceleration profile may be a first calibration acceleration profile, the second acceleration profile may be a second calibration acceleration profile, and the memory may store further instructions for additionally controlling the one or more processors to: f) cause the first robot arm to move according to a first operational acceleration profile associated with the first calibration acceleration profile after d) when the first motion data attributable to the movement of the first robot arm according to the first acceleration profile does not exceed the first threshold motion metric, and g) cause the first robot arm to move according to a second operational acceleration profile associated with the second calibration acceleration profile after e) when the first motion data attributable to the movement of the first robot arm according to the first acceleration profile exceeds the first threshold motion metric and the first motion data attributable to the movement of the first robot arm according to the second acceleration profile does not exceed the first threshold motion metric.

In some other or additional implementations, the apparatus' memory may store further instructions for additionally controlling the one or more processors to, prior to a) and e): h) determine, after f) or g), whether the first motion data attributable to the movement of the first robot arm according to the first or second operational acceleration profile exceeds a second threshold motion metric, i) cause the first robot arm to move according to a third operational acceleration profile when the first motion data attributable to the movement of the first robot arm according to the first or second operational acceleration profile exceeds the second threshold motion metric, when the first motion data attributable to the movement of the first robot arm according to the third operational acceleration profile stays within the second threshold motion metric.

In some such implementations, the memory may store further instructions for additionally controlling the one or more processors to: j) cause the first robot arm to move N additional times according to the first operational acceleration profile after d) and without performing a) or e) for N additional semiconductor wafers when the first motion data attributable to the movement of the first robot arm according to the first calibration acceleration profile does not exceed the first threshold motion metric, and k) cause the first robot arm to move N additional times according to the second operational acceleration profile after e) and without performing a) or e) for the N additional semiconductor wafers when the first motion data attributable to the movement of the first robot arm according to the first calibration acceleration profile exceeds the first threshold motion metric and the first motion data attributable to the movement of the first robot arm according to the second calibration acceleration profile does not exceed the first threshold motion metric, wherein N is an integer greater than or equal to 1.

In some additional such implementations, the memory may store further instructions for additionally controlling the one or more processors to: l) cause the first robot arm to move according to a third calibration acceleration profile after d) when the first motion data attributable to movement of the first robot arm according to the first acceleration profile is below the first threshold motion metric, when the first motion data attributable to movement of the first robot arm according to the third calibration acceleration profile stays within the first threshold motion metric; and m) cause the first robot arm to move according to a third operational acceleration profile associated with the third calibration acceleration profile after l) when the first motion data attributable to the movement of the first robot arm according to the first acceleration profile is below the first threshold motion metric and the first motion data attributable to the movement of the first robot arm according to the third acceleration profile does not exceed the first threshold motion metric. In some such implementations, the first motion data attributable to the third calibration acceleration profile may exceed the first motion data attributable to the first calibration acceleration profile.

In some other or additional implementations, the first acceleration profile of the apparatus may be a first operational acceleration profile, and the second acceleration profile may be a second operational acceleration profile.

In some other or additional implementations, the first sensor of the apparatus may be an optical sensor.

In some other or additional implementations, the first sensor of the apparatus may be a vacuum sensor.

In some other or additional implementations, the first robot arm of the apparatus may support the first sensor.

In some other or additional implementations, the first sensor of the apparatus may be supported in a location that is fixed with respect to the first robot arm.

In some implementations, a semiconductor wafer handling method may be provided. The method may include: n) moving a first robot arm, including a first end effector supporting a first semiconductor wafer, according to a first calibration acceleration profile, o) receiving first sensor data from a first sensor configured to detect relative movement between the first semiconductor wafer and the first end effector, p) analyzing the first sensor data to determine first motion data based on relative movement of the first semiconductor wafer with respect to the first end effector during motion of the first robot arm while the first semiconductor wafer is supported by the first end effector, and q) determining whether the first motion data attributable to movement of the first robot arm according to the first calibration acceleration profile exceeds a first threshold motion metric.

In some such implementations, the method may further include: r) determining that the first motion data attributable to movement of the first robot arm according to the first calibration acceleration profile exceeds the first threshold motion metric, s) moving the first robot arm, including the first end effector supporting the first semiconductor wafer, according to a second calibration acceleration profile, t) determining that the first motion data attributable to movement of the first robot arm according to the second calibration acceleration profile does not exceed the first threshold motion metric, and u) selecting a second operational acceleration profile associated with the second calibration acceleration profile. In some such implementations, the method may further include: v) moving the first robot arm, after u), according to the second operational acceleration profile associated with the second calibration acceleration profile.

In some further or additional implementations, the method may further include: w) determining that the first motion data attributable to movement of the first robot arm according to the first calibration acceleration profile does not exceed the first threshold motion metric, and x) selecting a first operational acceleration profile associated with the first calibration acceleration profile. In some such implementations, the method may further include: y) moving the first robot arm, after x), according to the first operational acceleration profile associated with the first calibration acceleration profile.

In some implementations, another semiconductor wafer handling method may be provided. The method may include: moving a first robot arm, including a first end effector supporting a first semiconductor wafer, according to a first operational acceleration profile, receiving a first sensor data from a first sensor configured to detect relative movement between the first semiconductor wafer and the first end effector, analyzing the first sensor data to determine a first motion data based on relative movement of the first semiconductor wafer with respect to the first end effector during motion of the first robot arm while the first semiconductor wafer is supported by the first end effector, determining that the first motion data attributable to movement of the first robot arm according to the first operational acceleration profile exceeds a first threshold motion metric, and moving the first robot arm according to a second operational acceleration profile when the first motion data attributable to movement of the first robot arm according to the first operational acceleration profile exceeds the first threshold motion metric, when the first motion data attributable to movement of the first robot arm according to the second operational acceleration profile stays within the first threshold motion metric.

In some such implementations, the method may further include that the first operational acceleration profile is a pre-determined acceleration profile. In some such implementations, the method's second operational acceleration profile is a pre-determined acceleration profile.

In some further or additional implementations, the method may further include moving the first robot arm N additional times according to the second operational acceleration profile for N additional semiconductor wafers when the first motion data attributable to the movement of the first robot arm according to the first operational acceleration profile exceeds the first threshold motion metric and the first motion data attributable to movement of the first robot arm according to the second operational acceleration profile does not exceed the first threshold motion metric, wherein N is an integer greater than or equal to 1.

These and other aspects of this disclosure are explained in more detail with reference to the accompanying Figures listed below.

DETAILED DESCRIPTION

The present inventor has conceived of a wafer handling traction control system that is able to detect slippage of a semiconductor wafer with respect to an end effector that supports and moves the semiconductor wafer and that is able to adjust the end effector's movement in order to minimize further slippage. The wafer handling traction control system may include a sensor that detects relative motion between the semiconductor wafer and the end effector. Upon the detection of relative motion past a threshold amount, the end effector's movements are adjusted to reduce or eliminate slippage of the semiconductor wafer.

It is to be understood that, as used herein, the term "semiconductor wafer" may refer both to wafers that are made of a semiconductor material, e.g., silicon, and wafers that are made of materials that are not generally identified as semiconductors, e.g., epoxy, but that typically have semiconductor materials deposited on them during a semiconductor manufacturing process. Handling of both types of wafers is considered to be within the scope of this disclosure.

Robot arms with end effectors are used to pick and place semiconductor wafers. The end effectors are typically configured to support the semiconductor wafer while the semiconductor wafer moves to a destination, e.g. a semiconductor process chamber, loadlock, or other station. One conventional approach to semiconductor wafer handling is to utilize a sensor or sensors to detect when the semiconductor wafer is no longer supported by the end effector and to stop movement of the robot arm when the semiconductor wafer is no longer supported by the end effector. In this conventional approach, movement of the robot arm is not adjusted before the end effector no longer supports the semiconductor wafer. By contrast, wafer handling traction control systems such as described herein are able to detect the slippage past a certain threshold of the semiconductor wafer relative to the end effector and adjust the movement of the robot arm so that the semiconductor wafer does not slip off the end effector during further movement of the end effector.

Figure 1:
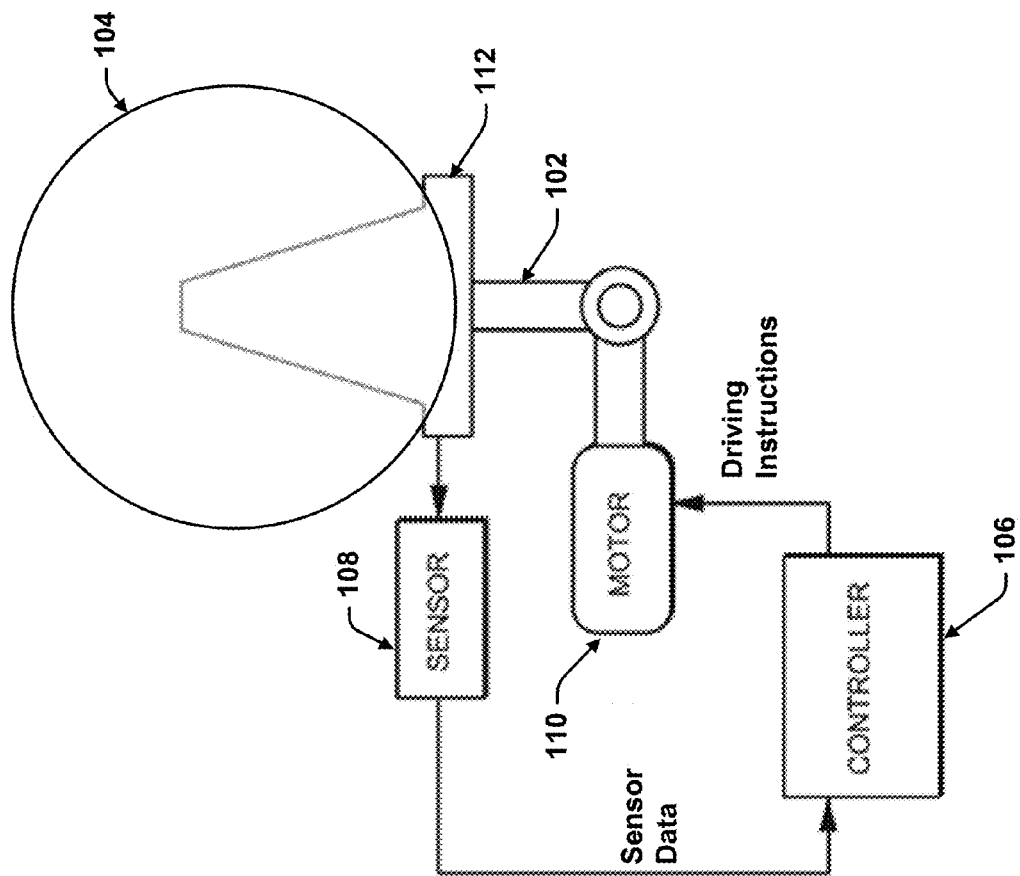
FIG. 1 shows a diagram representation of certain components of a semiconductor wafer handling system utilizing a wafer handling traction control system.

FIG. 1 shows a diagram representation of certain components of a semiconductor wafer handling system utilizing a wafer handling traction control system. The implementation shown in FIG. 1 includes a first robot arm 102 with an end effector 112, a semiconductor wafer 104, a controller 106, a sensor 108, and a motor 110. The components shown in FIG. 1 may be a part of a semiconductor tool.

The robot arm 102 is configured to handle a semiconductor wafer or multiple semiconductor wafers. The robot arm 102 may be configured to move from at least a first position to a second position during semiconductor wafer handling.

In certain implementations, the robot arm 102 may be configured to also move between additional positions.

The robot arm 102 may include the end effector 112. The end effector 112 may be configured to hold the semiconductor wafer 104 during semiconductor wafer handling. The end effector 112 may typically be a "blade" type end effector, e.g., spatula-like. Many blade-type end effectors rely on gravity and friction to hold the semiconductor wafer in place with respect to the end effector during movement; moving the end effector too quickly may cause the inertial forces of the semiconductor wafer to overcome the friction forces due to gravity—this causes the semiconductor wafer to slip with respect to the end effector. It is also common for the semiconductor wafer 104 to be supported by the end effector 112 in a manner that reduces contact between the semiconductor wafer 104 and the end effector 112 to reduce the risk of damage to the semiconductor wafer 104 or the potential for generating particulates. One common mechanism for providing such reduced wafer/end effector contact is to utilize a plurality of contact pads, e.g., three or four contact pads. The contact pads may be made from a compliant material, e.g., an elastomer, to reduce the risk of damage to the semiconductor wafer 104 and to increase the static and dynamic friction constants that act on the semiconductor wafer/end effector contact interface. These contact pads may be quite small, e.g., less than 0.25" in diameter in the contact area. Robot arm 102 may be moved by the motor 110. The motor 110 may be any type of suitable motor including stepper motors. The motor 110 may directly move the robot arm 102 or may move the robot arm 102 indirectly through a drive mechanism connected to the robot arm 102. When the robot arm 102 is moved, the end effector 112 may be moved as well according to the movements of the robot arm 102. In certain implementations, there may be more than one robot arm, each with its own end effector.

The controller 106 may control the motor 110. The controller 106 may include one or more physical or logical controllers, one or more memory devices, and one or more processors. The processor may include a central processing unit (CPU) or computer, analog and/or digital input/output connections, stepper motor controller boards, and other like components. Instructions for implementing appropriate control operations may be executed by the processor. These instructions may be stored on the memory devices associated with or part of the controller or they may be provided over a network. In certain implementations, the controller 106 executes system control software or logic.

The system control logic may include instructions for controlling the motor, controlling the movement of the robot arm through the motor, receiving signals from the sensor, as well as other instructions needed during semiconductor wafer handling according to the various techniques discussed herein. The system control logic for controlling the motor may include controlling the motor through instructions for the motor to run according to various acceleration profiles.

Typically, the acceleration profile (or commands and data that cause the motor(s) to operate according to a particular acceleration profile) will be stored in the memory of the controller or in a memory accessible by the controller, e.g., a network storage system. The controller may be coupled to the motor and output command instructions, e.g. voltages, bit signals, etc., to the motor to control the motor's movement of the robot arm according to a selected acceleration profile. The acceleration profile may be provided to the motor directly, e.g., the motor may accept input in the form of a voltage signal that controls motor acceleration, or the acceleration profile may be provided to the motor indirectly, e.g., the motor may accept input in the form of a voltage signal that controls motor velocity (and thus the speed with which the voltage signal changes may result in a particular acceleration).

System control logic may be provided using various types of technologies, including, but not limited to, the examples discussed herein. For example, in general, the instructions used to control the apparatus may be designed or configured in hardware and/or software. It may be said that the instructions are provided by "programming". The programming may be hard-coded, e.g., in digital signal processors, as part of an application-specific integrated circuit (ASIC), or other devices which have specific algorithms implemented as hardware. In other implementations, programming may be provided as software stored in volatile or non-volatile memory. Programming is also understood to include software or firmware instructions that may be executed on a general purpose processor. System control software may be coded in any suitable computer-readable programming language.

Various subroutines or control objects may be written to control operation of the motor and the robot arm for handling semiconductor wafers. In some implementations, system control software may include input/output control (IOC) sequencing instructions for controlling the various parameters described herein. For example, the semiconductor wafer handling process may be broken into multiple phases with correspondingly different acceleration curves or profiles, each of which may be defined by its own set of acceleration parameters. Each phase of a semiconductor wafer handling process may be controlled by one or more instructions executed by the system controller.

In some implementations, there may be a user interface associated with the system controller. The user interface may include a display screen, graphical software displays of the apparatus and/or process conditions, and user input devices such as pointing devices, keyboards, touch screens, microphones, etc. Such a user interface may be used, for example, to adjust various parameters that affect system performance, e.g., acceleration curves, setpoints, thresholds, etc.

In some implementations, parameters relating to operation conditions may be adjusted by the system controller. Non-limiting examples include the size of the semiconductor wafer, the configuration of the end effector supporting the semiconductor wafer, the type of semiconductor wafer handled, etc.

Signals for monitoring the semiconductor wafer handling process may be provided by analog and/or digital input connections of the system controller with a sensor or multiple sensors. The signals for controlling the wafer handling process may be received by the controller via analog and/or digital output connections of the robot, motor, and/or sensor. Non-limiting examples of sensors (in addition to sensor 108) that may be used to monitor the semiconductor wafer handling process include sensors for measuring the angle of rotation of the semiconductor wafer, the position of the semiconductor wafer, the angle of rotation of the end effector, the position of the end effector, etc. Appropriately programmed feedback and control algorithms may be used with data from these sensors to maintain process control of the robot arm.

The sensor 108 may be configured to detect the relative motion of the semiconductor wafer 104 relative to the end effector 112 and output sensor data indicative of such relative motion to the controller 106. Certain implementations of wafer handling traction control may utilize sensors that may detect the motion of the end effector and/or the semiconductor wafer relative to a certain frame of reference. The frame of reference may be any frame of reference fixed or moving, including, but not limited to the end effector or another frame of reference. The motion detected by the sensor may be acceleration, velocity, displacement, or another type of motion. The controller may contain logic to calculate other types of motions from the motion detected. For example, if an implementation contains a sensor that detects displacement, the controller may calculate velocity from the detected displacement through measuring the change in displacement compared to timing signals from an internal clock in the controller. The change in displacement through time would indicate velocity.

In certain implementations, the sensor 108 may be configured to detect relative motion of the semiconductor wafer 104 with respect to the end effector 112 through a feature on the semiconductor wafer 104 such as a notch, a slot, a pattern, or another feature that may be readily detectable by the sensor 108. In other implementations, the sensor 108 may be configured to detect relative motion of the semiconductor wafer 104 with respect to the end effector 112 without any corresponding engineered feature on the semiconductor wafer 104. Instead, the sensor 108 may detect the movement of the semiconductor wafer 104 with respect to the end effector 112 by monitoring the surface of the semiconductor wafer.

The sensor 108 may, for example, be an optical sensor supported on the end effector 112 that emits a beam of light that is configured to interact with a pattern on the semiconductor wafer 104. Such a pattern may be an engineered pattern, e.g., a photolithographically-produced pattern, or it may be a texture or pattern that is inherent to the semiconductor wafer 104, e.g., the surface finish or roughness of the semiconductor wafer may prove to be sufficiently rough that an optical detector may be capable of registering the surface roughness and measuring the amount of displacement that occurs when the semiconductor wafer 104 slips with respect to the end effector 112, e.g., by the amount that a particular surface roughness pattern "moves." The amount of light reflected by the pattern may change depending on which area of the pattern the light shines on. Relative motion between the semiconductor wafer 104 and the end effector 112 may be detected by the sensor 108 through changes in the amount of light reflected. The sensor 108 may output the sensor data detailing the amount of light reflected to the controller 106. Through the changes in the amount of light reflected, the controller may be able to determine first motion data. The first motion data may be indicative of the relative motion of the semiconductor wafer 104 with respect to the end effector 112. Depending on the first motion data derived, the controller 106 may elect to change the acceleration profile according to which the motor 110 runs. In other implementations, other sensors may be used as well, including, but not limited to, machine vision sensors (which may move with the base and the robotic arm, or which may observe the robotic arm from a fixed position remote from the base and the robotic arm). Other implementations may also mount the sensor in other locations, such as through accelerometers mounted on the semiconductor wafer, the accelerometer acting as a mounted sensor to detect motion of the semiconductor wafer. Such an implementation may use the semiconductor wafer with the mounted sensor as a calibration wafer. The calibration wafer may be used for slip threshold detection of a batch of similar semiconductor wafers in a manner similar to that detailed in FIG. 7.

An example of a suitable sensor 108 may be an optical sensor such as is used on an optical mouse. Past optical sensors for computer mice have required that the mouse be used on rough or non-shiny surfaces in order to provide accurate measurement of the movement of the mouse with respect to the mousing surface. More recent mouse designs, e.g., mouse designs with photon based sensors such as LED or laser mice, have incorporated more sensitive optical detectors capable of providing accurate mouse movement measurements on highly polished surfaces, e.g., glass. Similar sensors may be used to measure relative motion between the semiconductor wafer and the end effector.

Other types of optical sensors may also be suitable sensors. For example, machine imaging sensors or charge coupled devices ("CCD") may be used. Such sensors may detect movement through imaging of the semiconductor wafer from above, or through an array of sensors located around the edges of the semiconductor wafer to detect movement of the edges of the semiconductor wafer (for example, two linear-strip CCD devices on the end effector and aligned with radii of a wafer and placed such that the wafer edge is nominally centered on both strips may serve to provide measurements of edge location at two points on the circumference of the wafer, allowing the wafer position to be calculated). Broken-beam sensors may also be used to detect movement of the edges of the semiconductor wafer. Alternatively, multiple ultrasonic sensors configured to measure the distance to the edge of the semiconductor wafer may also be used to detect movement of the edges of the semiconductor wafer.

Another example of a suitable sensor 108 may be a mechanical sensor, such as a small rotating sensor, e.g., a scroll wheel or ball, touching the bottom of the semiconductor wafer.

Figure 2:
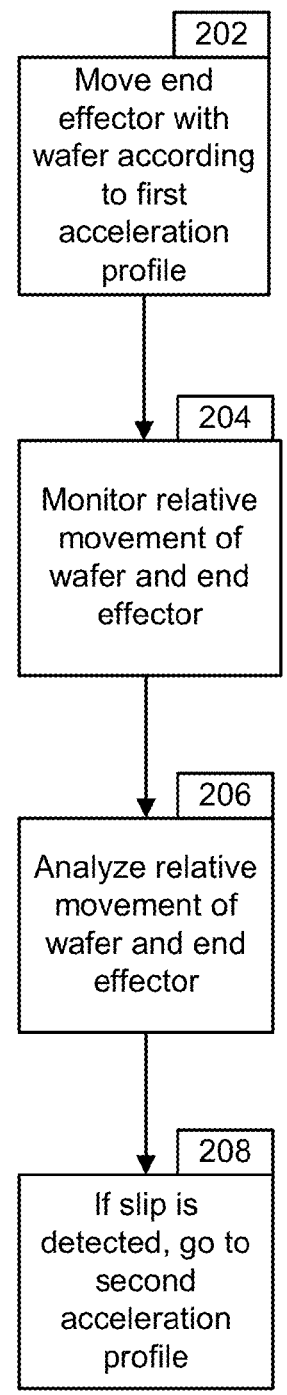
FIG. 2 shows a flow diagram detailing an example technique for wafer handling traction control.

FIG. 2 shows a flow diagram detailing an example technique for wafer handling traction control. FIG. 2 shows the operation of semiconductor wafer handling utilizing a wafer handling traction control system at a high level. FIG. 2 may be performed in a test procedure before the semiconductor wafer has been transported to its destination, or FIG. 2 may be performed as the semiconductor wafer is being transported to its destination—the first/second acceleration profiles indicated may be calibration acceleration profiles or operational acceleration profiles, depending on the particular wafer traction control technique utilized. Some techniques, discussed later in this paper, may utilize both types of profiles.

In block 202 the controller may instruct the motor to move the end effector according to a first acceleration profile. In block 202, the end effector is moved while the end effector is supporting the semiconductor wafer.

While the end effector is moved according to the first acceleration profile, any relative motion of the semiconductor wafer with respect to the end effector may be monitored, as shown in block 204. In certain implementations, block 204 may monitor the relative motion of the semiconductor wafer with respect to the end effector through a sensor supported by the end effector, another portion of the robot arm, or mounted to another portion of the semiconductor tool; the sensor may produce relative motion data that is indicative of the relative motion, if any, between the semiconductor wafer and the end effector.

In block 206, the relative motion data may be analyzed by the controller and used to derive a first motion data. For example, the first motion data may be based on the relative displacement, relative velocity, relative acceleration, or relative jerk of the semiconductor wafer with respect to the end effector, as derivable from the relative motion data. In some cases, the first motion data may be the same as the relative motion data. For example, if the first motion data is displacement and the sensor used outputs relative motion data that indicates displacement, then the analysis that is performed may consist, in some examples, of merely treating the relative motion data as the first motion data. In other cases, there may be more involved processing needed. For example, displacement-type relative motion data may be transformed into velocity-type or acceleration-type first motion data by performing one or more differentiations. In some cases, it may be necessary to apply various correction factors or scaling factors to the relative motion data produced by the sensor to obtain first motion data that is calibrated to established unit systems, e.g., the relative motion data may be in the form of volts, and a conversion factor may be used to transform such voltage output into displacement units, e.g., X millimeters per millivolt. The first motion data may also be derived from inputting relative motion data into an equation, e.g., the first motion data may be the output of an equation utilizing the relative velocity and relative acceleration as inputs. An equation of such an equation would be 2v+4a where "v" is the relative velocity and "a" is the relative acceleration. In the example equation, relative acceleration is weighted twice as much as relative velocity. In other such equations, the weighting given to different types of relative motion data may be unequal, e.g., relative velocity may be weighted higher than relative acceleration or relative displacement, or the weighting of a type of relative motion may change depending on the magnitude of that type of relative motion, e.g., relative velocity above 2 m/s may be given twice the weight as relative velocity equal to or below 2 m/s.

If the first motion data exceeds a certain threshold, such as a first threshold motion metric, the controller instructs the motor to move the end effector according to a second acceleration profile, as shown in block 208. The first threshold motion metric may, for example, be a maximum total amount of relative displacement that occurs during movement according to the first acceleration profile, a maximum relative velocity between the semiconductor wafer and the end effector, or other metric that may be determined to indicate unacceptable relative slip between the semiconductor wafer and the end effector. In certain implementations, movement of the end effector according to the second acceleration profile is configured to result in lower first motion data than movement of the end effector according to the first acceleration profile. The second acceleration profile may be an acceleration profile which accelerates or decelerates the end effector at a lower rate than the first acceleration profile in certain portions of the acceleration profile or throughout the entire acceleration profile.

Figure 3:
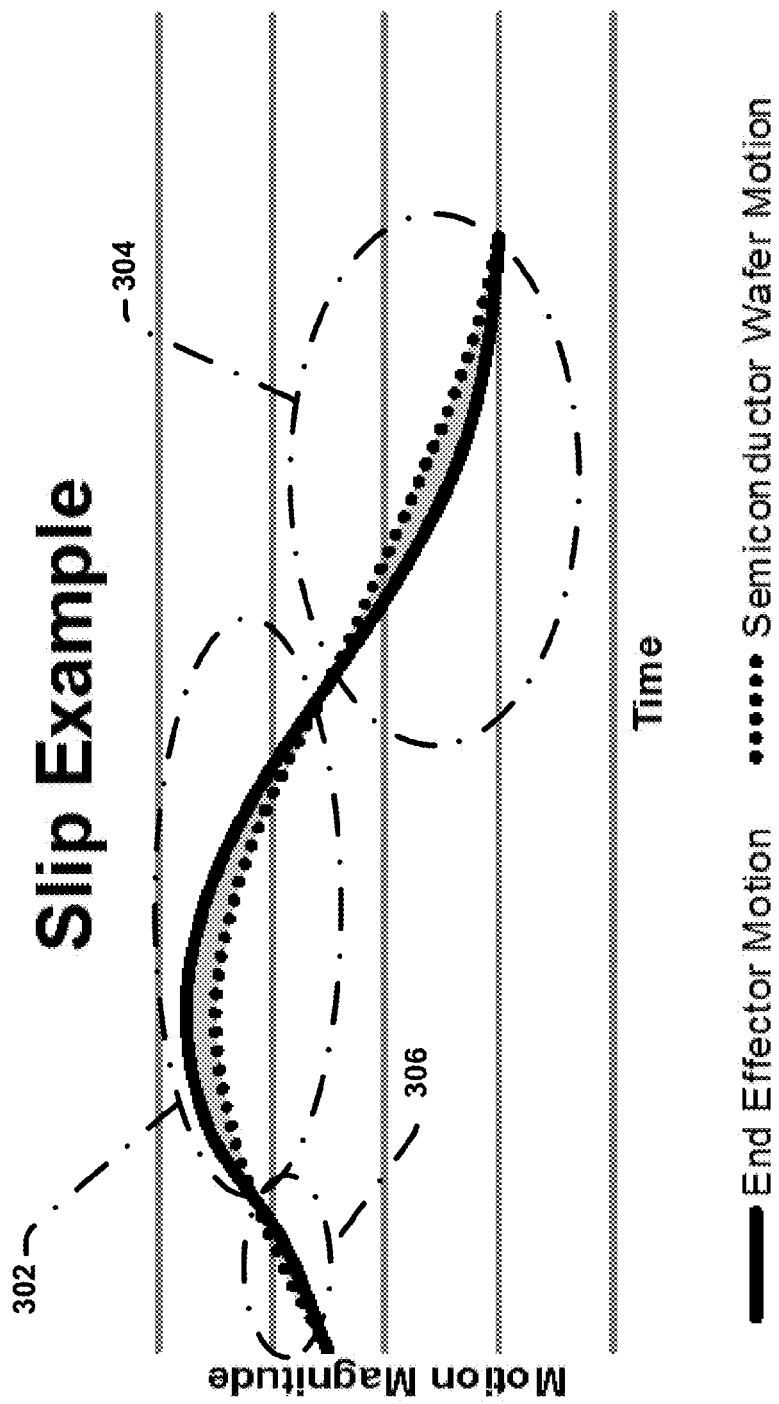
FIG. 3 is a graph of the motion of an end effector and a semiconductor wafer supported by the end effector with portions highlighted where relative motion between the end effector and the semiconductor wafer has occurred.

FIG. 3 is a graph of the motion of an end effector and a semiconductor wafer supported by the end effector with portions highlighted where relative motion between the end effector and the semiconductor wafer has occurred. In FIG. 3, the solid line is the plot of the motion for the end effector while the dotted line is the plot of the motion for the semiconductor wafer. The motion of the end effector and the semiconductor wafer in FIG. 3 should not be confused with the first motion data of block 206. The first motion data may be derived from the relative motion of the semiconductor wafer with respect to the end effector while the graph in FIG. 3 shows the individual absolute motions of the end effector and the semiconductor wafer with respect to a common reference frame, though the relative motion between the end effector and the semiconductor wafer may be calculated by comparing the two data sets. The motion in FIG. 3 may be any type of motion including displacement, velocity, and acceleration.

The y-axis of FIG. 3 corresponds to the magnitude of the motion. In FIG. 3, the y-axis is shown in a linear scale. The x-axis of FIG. 3 corresponds to time.

Sections 302 and 304 in FIG. 3 are two sections of the graph of the motion of the end effector and the semiconductor wafer that show relative motion between the end effector and the semiconductor wafer which may exceed the certain threshold. Several methods may be used to determine that the relative motion between the end effector and the semiconductor wafer has exceeded the threshold. These methods include comparing the difference in magnitude between the end effector motion plot and the semiconductor wafer motion plot at certain points in time in sections 302 and 304 to a threshold magnitude to determine whether an instantaneous relative motion threshold of the semiconductor wafer with respect to the end effector has been exceeded, comparing the difference in area under the curve of the plots of the end effector motion and the semiconductor wafer motion (shown as the gray areas in FIG. 3) to a threshold area to determine whether a total relative motion threshold of the semiconductor wafer with respect to the end effector has been exceeded, as well as other methods.

In FIG. 3, section 306 shows a section where the relative motion between the end effector and the semiconductor wafer may not have exceeded the threshold even though there is a difference between the motion of the end effector and the motion of the semiconductor wafer. In section 306, the relative motion between the end effector and the semiconductor wafer may be determined to have not exceeded the threshold by comparing the difference in magnitude between the end effector motion plot and the semiconductor wafer motion plot at any point in time in section 306 to determine that an instantaneous relative motion threshold of the semiconductor wafer with respect to the end effector has not been exceeded, by comparing the difference in area under the curve of the plots of the end effector motion and the semiconductor wafer motion to determine that a total relative motion threshold of the semiconductor wafer with respect to the end effector has not been exceeded, as well as other methods.

Figure 4:
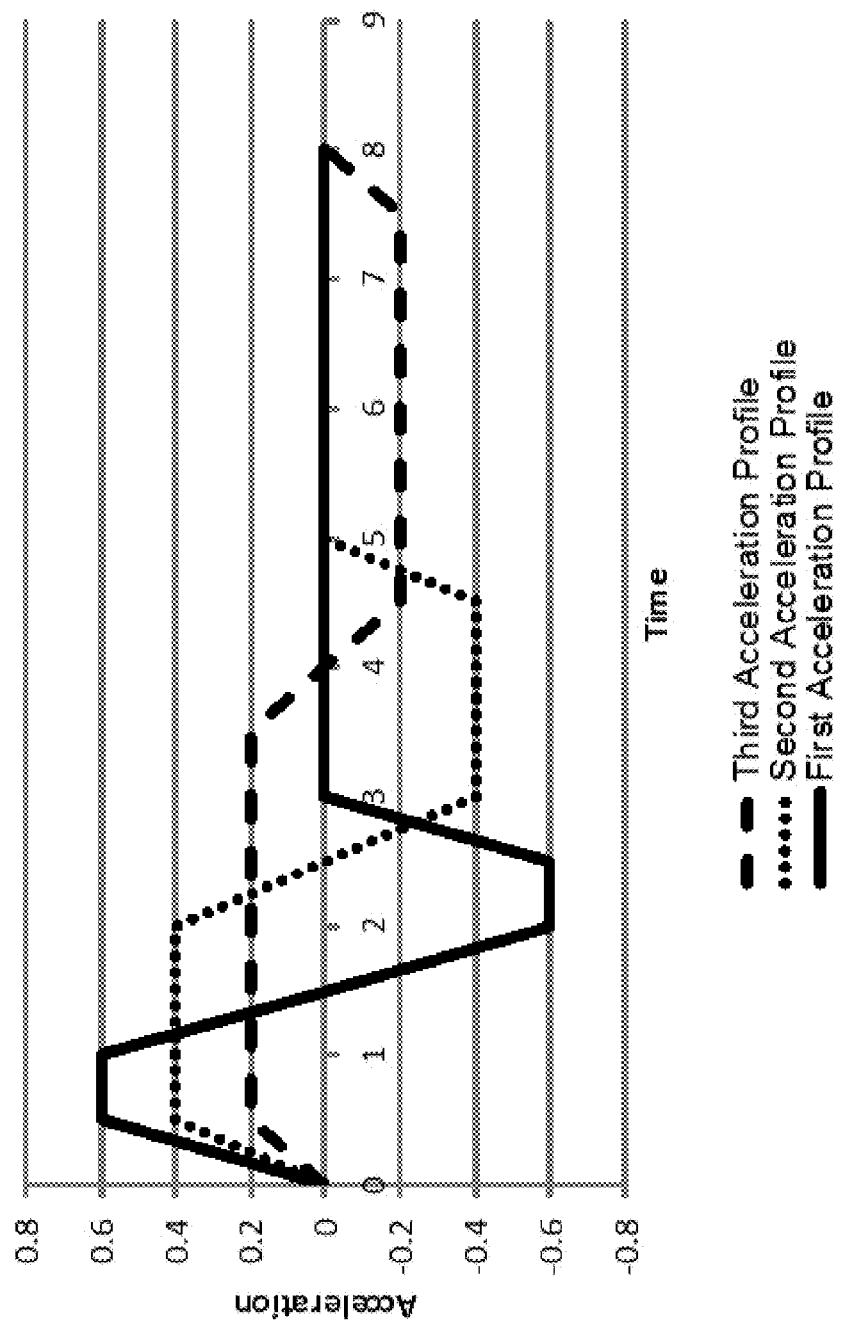
FIG. 4 is a graph of example acceleration profiles for an end effector.

FIG. 4 is a graph of example acceleration profiles for an end effector. FIG. 4 shows three example acceleration profiles, a first acceleration profile, a second acceleration profile, and a third acceleration profile, plotted against time. The acceleration profiles of FIG. 4 are intended to be demonstrative and not representative. The units shown are intended for reference purposes only. The acceleration profiles shown in FIG. 4 feature linear acceleration, but the acceleration profiles used may also include acceleration profiles that include non-linear acceleration. It is to be understood that the use of the term "acceleration" herein encompasses both positive acceleration and negative acceleration (deceleration).

In FIG. 4, the first acceleration profile is the acceleration profile with the highest peak acceleration, at a peak acceleration of 0.6 nominal acceleration units. The first acceleration profile also has the highest peak deceleration, at a peak deceleration of −0.6 nominal acceleration units. In FIG. 4, the first acceleration profile has the shortest time spent accelerating and decelerating, at a total acceleration and deceleration time of 3 nominal time units, since a given distance may be covered in a shorter time period with higher acceleration and deceleration. In semiconductor wafer handling utilizing a wafer handling traction control system, if relative motion of the semiconductor wafer with respect to the end effector exceeding the threshold is detected while accelerating the end effector with the first acceleration profile, (i.e., if the first motion data exceeds the first threshold motion metric) another acceleration profile such as the second acceleration profile or the third acceleration profile may be selected and the end effector may be moved according to the newly-selected acceleration profile.

The second acceleration profile has a peak acceleration of 0.4 nominal acceleration units and a peak deceleration of −0.4 nominal acceleration units. In FIG. 4, the second acceleration profile has lower peak acceleration/deceleration compared to the peak acceleration/deceleration of the first acceleration profile, but higher peak acceleration/deceleration compared to the peak acceleration/deceleration of the third acceleration profile. In FIG. 4, the second acceleration profile, at 5 nominal units spent accelerating/decelerating, has a longer time spent accelerating/decelerating compared to the first acceleration profile and a shorter time spent accelerating/decelerating compared to the third acceleration profile. In semiconductor wafer handling utilizing a wafer handling traction control system, if relative motion of the semiconductor wafer with respect to the end effector exceeding the threshold is detected while accelerating the end effector with the second acceleration profile, another acceleration profile such as the third acceleration profile may be selected and the end effector may be moved according to the third acceleration profile.

The third acceleration profile has a peak acceleration of 0.2 nominal acceleration units and a peak deceleration of −0.2 nominal acceleration units. In FIG. 4, the third acceleration profile is the acceleration profile with lowest peak acceleration/deceleration and the longest time spent accelerating decelerating at 8 nominal time units.

Other acceleration profiles utilized in semiconductor wafer handling utilizing wafer handling traction control system may have different acceleration profile shapes. For example, other acceleration profiles may accelerate and decelerate multiple times in one profile. For those acceleration profiles that accelerate and decelerate multiple times in one profile, each sequence of acceleration or deceleration may have different magnitudes for peak acceleration/deceleration or each sequence may have the same magnitude for peak acceleration/deceleration. Each sequence of acceleration or deceleration may also use different amounts of time to reach peak acceleration/deceleration, or each sequence may use the same amount of time to reach peak acceleration/deceleration.

When the first motion data attributable to the movement of the first robot arm according to a first acceleration profile exceeds the first threshold motion metric, the controller may be configured to select the next acceleration profile that exerts a lower force on the semiconductor wafer.

For example, in FIG. 4, the first acceleration profile may be defined as the acceleration profile that exerts the most force on the semiconductor wafer; the third acceleration profile may be defined as the acceleration profile that exerts the least force on the semiconductor wafer; and the second acceleration profile may be defined as the acceleration profile that exerts the second most force on the semiconductor. The controller may then instruct the motor to move the robot arm according to the first acceleration profile. If the first motion data of the movement of the robot arm according to the first acceleration profile is determined to exceed the first threshold motion metric, the controller may then select the second acceleration profile and instruct the motor to move the robot arm according to the second acceleration profile. If the first motion data of the movement of the robot arm according to the second acceleration profile is determined to exceed the first threshold motion metric, the controller may then select the third acceleration profile and instruct the motor to move the robot arm according to the third acceleration profile. In this way, the controller may step through the acceleration profiles so as to expose the semiconductor wafer to gradually decreasing forces. Thus, the controller is able to determine the acceleration profile that may exert the highest forces on the semiconductor wafer without producing unsatisfactory degrees of relative slip between the semiconductor wafer and the end effector.

In certain implementations, the controller may be configured to derive second motion data and/or utilize a second threshold motion metric if the first motion data attributable to movement of the robot arm according to the first acceleration profile exceeds the first threshold motion metric. If the first motion data exceeds the first threshold motion metric, the semiconductor wafer may already have displaced relative to the end effector and so is more likely to slip off the end effector than when the semiconductor wafer was first picked by the end effector. The second motion data and/or the second threshold motion metric may be configured to allow for less relative motion of the semiconductor wafer with respect to the end effector before the controller selects another acceleration profile. Utilization of the second motion data and/or second threshold motion metric may allow the controller to avoid a situation where, if the first threshold motion metric is exceeded multiple times, the semiconductor wafer may slip off the end effector.

In certain implementations, the controller may be programmed to skip acceleration profiles depending on the magnitude of how much the first motion data exceeds the first threshold motion metric. For example, if the first motion data of the movement of the robot arm according to the first acceleration profile exceeds the first threshold motion metric by a sufficient magnitude, the controller may select the third acceleration profile instead of the second acceleration profile and instruct the motor to move the first robot arm according to the third acceleration profile. In this case, the controller has skipped the second acceleration profile.

Figure 5:
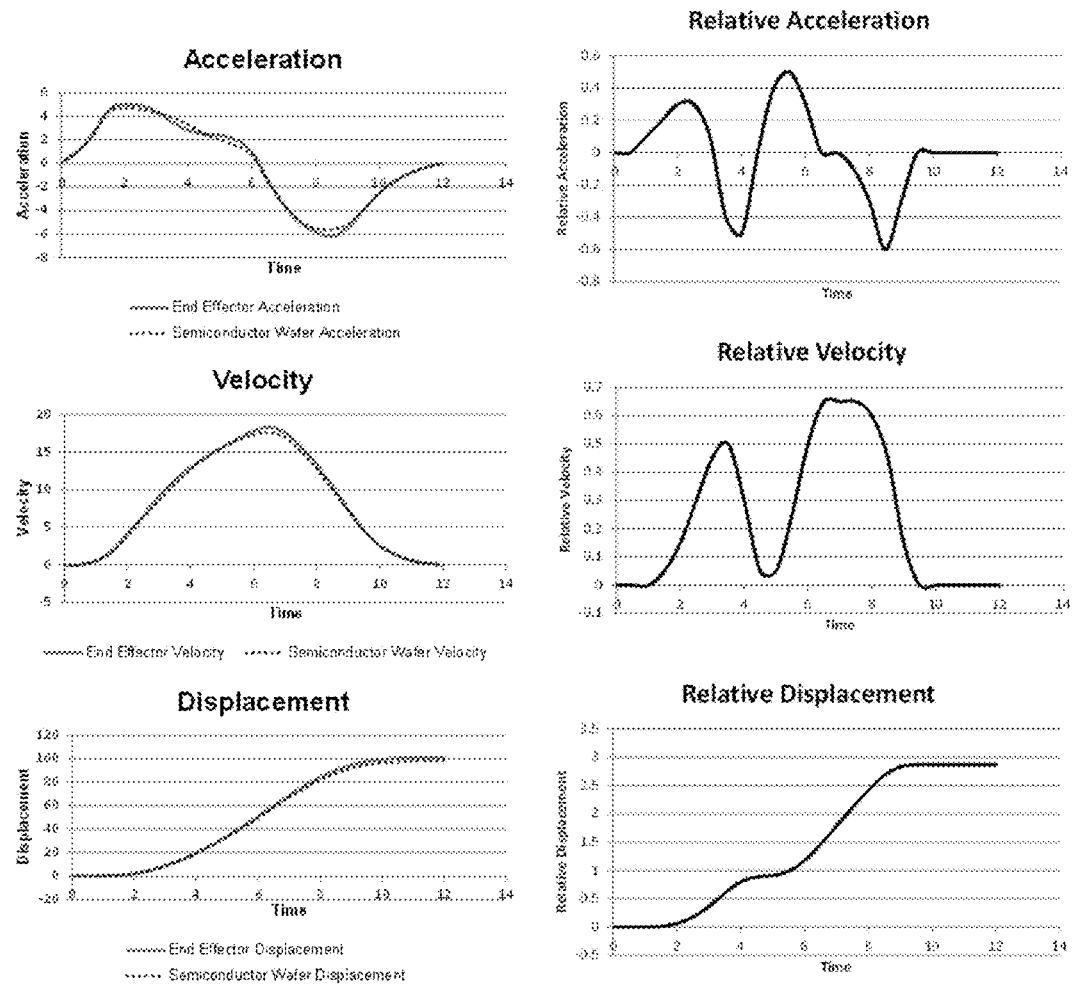
FIG. 5 shows graphs of the acceleration, velocity, and displacement of an end effector and a semiconductor wafer supported by the end effector.

FIG. 5 shows graphs of the acceleration, velocity, and displacement of an end effector and a semiconductor wafer supported by the end effector. The graphs show the motion of the end effector and the semiconductor wafer during an example wafer handling sequence. The magnitudes stated for acceleration, velocity, displacement, and time do not have units since the magnitudes are demonstrative.

The left side of FIG. 5 has graphs for the accelerations, velocities, and displacements of the end effector and the semiconductor wafer with respect to an external frame of reference. In the graphs, the end effector is represented by the solid gray line while the semiconductor wafer is represented by the dotted black line.

The top left graph of the accelerations of the end effector and the semiconductor wafer shows an example sequence where the end effector supporting the semiconductor wafer is first accelerated and then decelerated. The velocities corresponding to the accelerations are shown in the middle left graph. The corresponding displacements are shown in the bottom left graph.

The right side of FIG. 5 has graphs for the relative acceleration, relative velocity, and relative displacement of the semiconductor wafer with respect to the end effector. The relative acceleration, relative velocity, and relative displacement correspond to the differences in acceleration, velocity, and displacement between the end effector and the semiconductor wafer in the graphs to the left side of FIG. 5.

The top right graph of the relative acceleration of the semiconductor wafer with respect to the end effector shows the difference between the end effector acceleration and the semiconductor wafer acceleration of the top left graph.

The middle right graph is of the relative velocity of the semiconductor wafer with respect to the end effector. The relative velocity corresponds to the difference in end effector velocity and semiconductor wafer velocity of the middle left graph.

The bottom right graph is of the relative displacement of the semiconductor wafer with respect to the end effector. The relative displacement corresponds to the difference in end effector displacement and semiconductor wafer displacement of the bottom left graph. In certain implementations, the relative displacement of the semiconductor wafer with respect to the end effector may be detected directly through the sensor. For example, an optical sensor (similar to an optical sensor in an optical mouse) may be installed on the end effector, i.e., be stationary with respect to the end effector. The sensor may be oriented such that the sensor illuminates a portion of a semiconductor wafer when the semiconductor wafer is supported by the end effector. The sensor may then measure the degree to which the portion of the semiconductor wafer that is illuminated shifts over time, thus providing a direct measurement of relative displacement between the semiconductor wafer and the end effector.

In certain implementations, the sensor may detect one, some, or all of the acceleration, velocity, and/or displacement of the semiconductor wafer with respect to the end effector. Certain implementations of wafer handling traction control may utilize sensors which may detect the motion of the end effector and/or the semiconductor wafer relative to a certain frame of reference. The frame of reference may be the end effector, the semiconductor wafer, or another fixed frame of reference. The motion detected by the sensor may be acceleration, velocity, displacement. The controller may contain logic to transform the motion detected into other types of motion data. For example, if an implementation contains a sensor which detects relative displacement, the controller may calculate relative velocity from the detected relative displacement through measuring the change in relative displacement compared to an internal clock, indicating time, in the controller. The change in relative displacement over time would indicate the change in relative velocity.

The controller may utilize relative acceleration, relative velocity, and/or relative displacement, as factors in the calculation of the first motion data to detect relative motion of the semiconductor wafer with respect to the end effector past a first threshold motion metric. Relative displacement, relative velocity, or relative acceleration may be useful for indicating relative motion in different circumstances. The first threshold motion metric may be different in magnitude depending on the composition of the first motion data. For example, a controller solely utilizing relative acceleration to derive the first motion data may have a first threshold motion metric different in magnitude from the magnitude of the first threshold motion metric of a controller solely utilizing relative velocity to derive the first motion data.

For example, in FIG. 5 at time unit 1, there are approximately 0.5 nominal units of relative acceleration, but almost no relative velocity or relative displacement. The magnitude of relative acceleration is much higher than the magnitude of relative velocity or displacement. Thus, at time unit 1, a controller configured to solely utilize relative acceleration to derive a first motion data may detect relative motion of the semiconductor wafer with respect to the end effector, (i.e., the first motion data exceeds the first threshold motion metric,) but a controller configured to solely utilize relative velocity or relative displacement may not detect relative motion of the semiconductor wafer with respect to the end effector (since, if the controller were utilizing relative velocity or relative displacement, the first motion data may not have exceeded the first threshold motion metric due to the low magnitude of relative velocity or relative displacement).

In another example, a controller configured to derive the first motion data solely through relative displacement, with a first threshold motion metric of 1.0 units of relative displacement, may not have the first motion data exceed the first threshold motion metric until approximately 6 time units. However, a controller configured to derive the first motion data solely through relative velocity, with a first threshold motion metric of 0.5 units of relative velocity, may have the first motion data pass the first threshold motion metric before 4 time units. Since exceeding the first threshold motion metric may cause the controller to select a second acceleration profile, in the example above, the second controller calculating the first motion data solely through relative velocity will have selected the second acceleration profile before the first controller calculating the first motion data solely through relative displacement will have selected the second acceleration profile.

Figure 6:
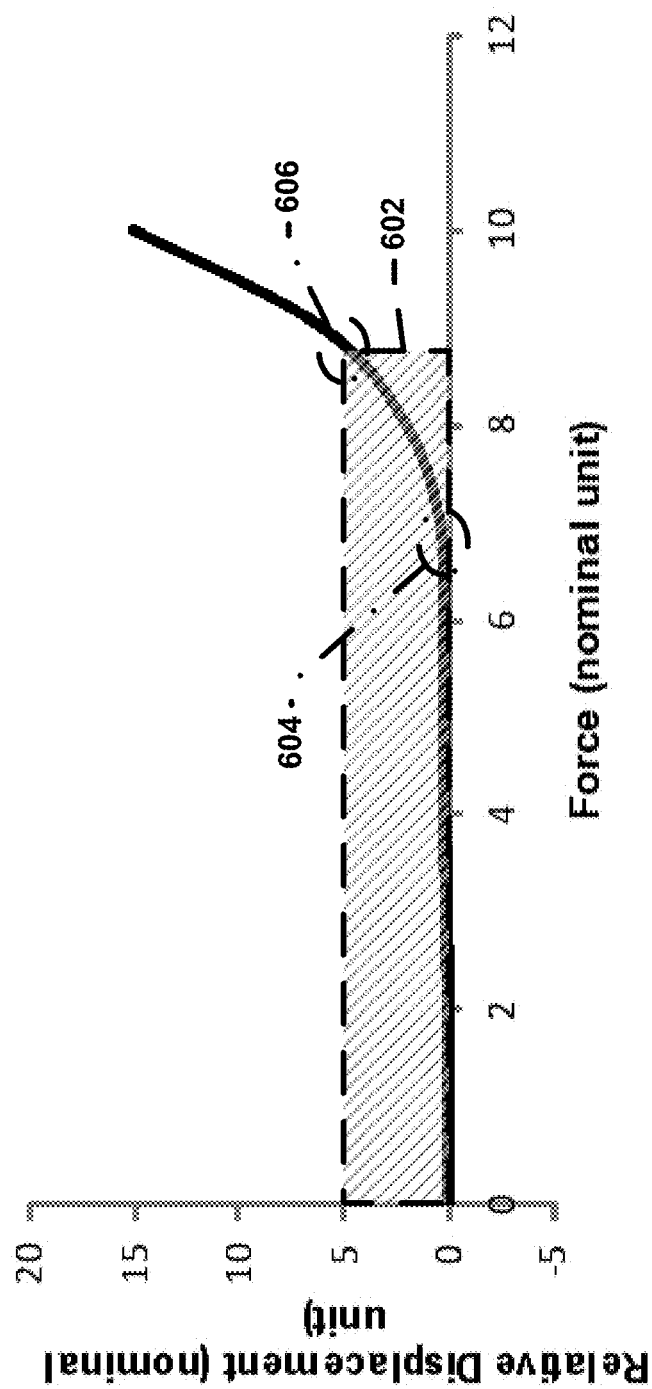
FIG. 6 is a graph showing wafer slippage versus force applied.

FIG. 6 is a graph showing wafer slippage versus force applied. FIG. 6 is for demonstrative purposes only and so all units in FIG. 6 are nominal units. In FIG. 6, the implementation has a first threshold motion metric of 5 nominal distance units. In FIG. 6, the first motion data corresponds to the relative displacement of the semiconductor wafer with respect to the end effector in a linear manner. That is, one nominal unit of the first motion data in FIG. 6 may correspond to one nominal unit of relative displacement of the semiconductor wafer with respect to the end effector. Other implementations may derive the first motion data using other factors or combination of factors. For example, other implementations may vary the weight of the factors depending on the magnitude of the factors. Thus, for a first motion data derived solely from relative velocity, relative velocity from 0 to 5 m/s may be weighted x (thus, relative velocity of 4 m/s would give a first motion data with the magnitude of 4), but relative velocity higher than 5 m/s may be weighted 2× (thus relative velocity 6 m/s would give a first motion data with the magnitude of 12). Different implementations may have their own weighting scale.

In FIG. 6, the relative displacement of the semiconductor wafer versus force applied is not linear. The semiconductor wafer in FIG. 6 is displaced minimally (or not at all) until point 604. At point 604, which is around 6.8 units of nominal force, the wafer begins to exhibit readily discernible displacement; this may generally correspond to the point where the force acting on the semiconductor wafer has exceeded the static friction force of between the semiconductor wafer and the end effector. After 6.8 units of force, the semiconductor wafer's relative displacement increases at a nonlinear rate per unit of nominal force applied, with increasingly large amounts of displacement per higher unit force applied. At point 606, which is around 8.6 units of nominal force, the semiconductor wafer has slipped the maximum acceptable amount in this example. Thus, 602 in FIG. 6 is the part of the graph where the semiconductor wafer slippage is within the acceptable amount of semiconductor wafer slippage.

In certain other implementations, the controller of the wafer handling traction control system may be configured to minimize semiconductor wafer slippage by attempting to keep the force applied below 6.8 units of force, the point where the semiconductor wafer begins to exhibit readily discernible displacement.

Figure 7:
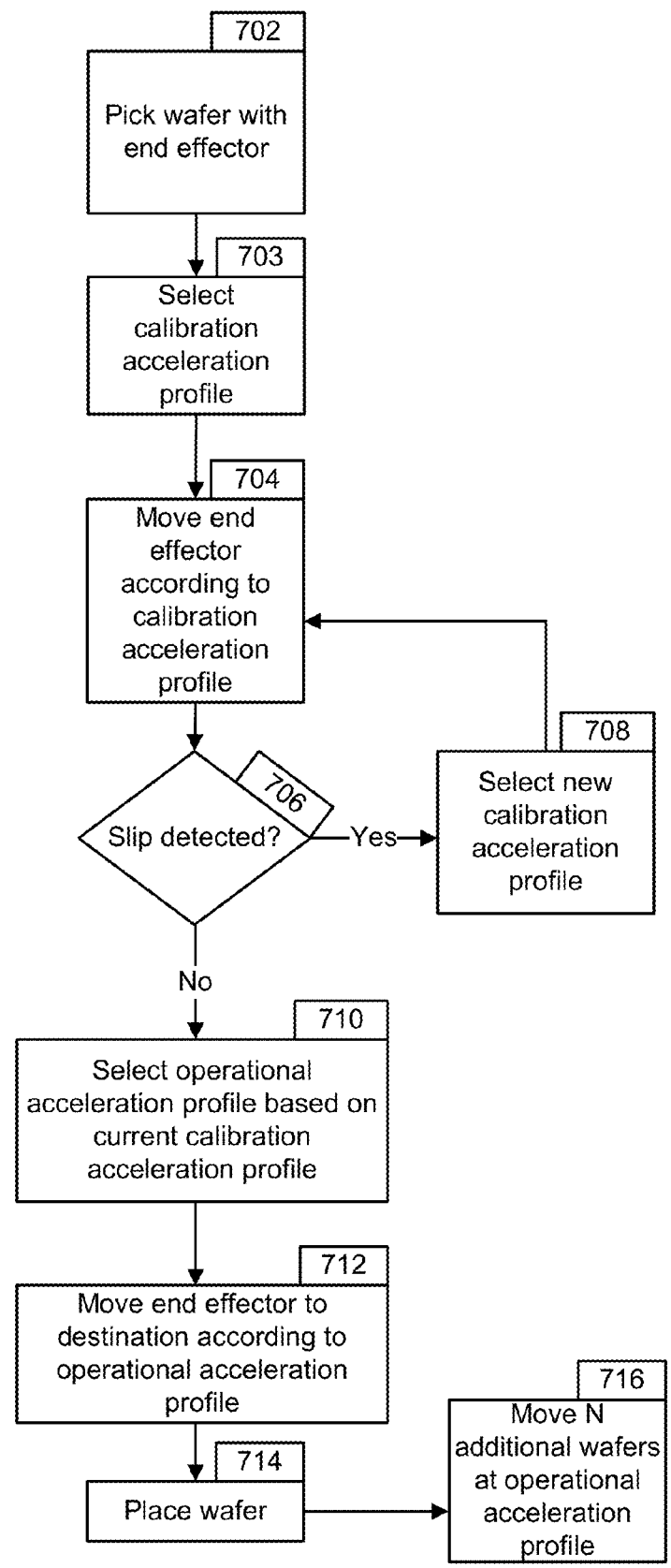
FIG. 7 shows a flow diagram detailing an example technique for slip threshold detection wafer handling traction control using calibration acceleration profiles.

FIG. 7 shows a flow diagram detailing an example technique for slip threshold detection wafer handling traction control using calibration acceleration profiles.

The technique may begin in block 702, where the semiconductor wafer may be picked by the end effector such that the semiconductor wafer rests on, and is supported by, the end effector, e.g., the semiconductor may be supported on elastomeric pads on the end effector. The end effector may be attached to a robot arm as detailed in FIG. 1.

In block 703, a calibration acceleration profile is selected. Calibration acceleration profiles, as used herein, are acceleration profiles that are not used during normal wafer transport from station to station, but that are instead used by the controller in order to determine what operational acceleration profile to use during such normal wafer transport from station to station. Operational acceleration profiles, as used herein, are used during wafer transport from station to station, e.g., they may govern the acceleration of the end effectors during normal operational use. Each calibration acceleration profile may correspond with an operational acceleration profile. Typically, as shown in FIG. 10C (discussed later), the calibration acceleration profiles may have a larger peak magnitude than their corresponding operational acceleration profiles and may also be much shorter in duration (as their primary purpose is to establish the highest acceleration, from a range of potential accelerations that does not produce unacceptable levels of relative slip between the semiconductor wafer and the end effector). Moving the robot arm with the motor according to the operational acceleration profile may exert a peak force on the semiconductor wafer lower than or equal to the peak force exerted on the semiconductor wafer while moving the robot arm with the motor according to the corresponding calibration acceleration profile. Calibration acceleration profiles and operational acceleration profiles may be profiles pre-loaded into the memory of the controller, determined by the controller during the handling of semiconductor wafers, input by an operator, or provided through other methods such as over a network in communication with the controller.

In block 704, the robot arm and the end effector are moved by the motor according to the calibration acceleration profile.

In block 706, a determination may be made as to whether there is slip of the semiconductor wafer past a threshold amount. In block 706, the sensor may monitor the relative motion of the semiconductor wafer with respect to the end effector. The sensor may output relative motion data to the controller. Slip may be detected by the controller if the first motion data derived from the relative motion data exceeds a first threshold motion metric. The first motion data may be derived through a variety of different methods, such as those discussed above with respect to FIG. 5. While the robot arm is moved, the controller may compare the first motion data with the first threshold motion metric. If the first motion data exceeds the first threshold motion metric, the controller may determine that there is slip of the semiconductor wafer past the threshold amount.

If, in block 706, there is slip detected of the semiconductor wafer past the threshold amount, a new calibration acceleration profile may be selected, as detailed in block 708. The controller may select a new calibration acceleration profile that may exert a lower peak force on the semiconductor wafer, such as through a lower peak acceleration, than the calibration acceleration profile that produced slip of the semiconductor wafer past the threshold amount. The technique may then return to block 704, where the robot arm may be moved according to the newly-selected calibration acceleration profile.

If no slip of the semiconductor wafer past the threshold amount is detected in block 706, then the operational acceleration profile corresponding to the acceleration profile of block 704 may be selected in block 710.

In block 712, the robot arm and the end effector are moved to the destination according to the operational acceleration profile selected in block 710. After the end effector reaches the destination, the end effector may place the semiconductor wafer in block 714.

In block 716, the end effector may pick, move, and place N additional semiconductor wafers according to the selected operational acceleration profile. After N additional semiconductor wafers are picked, moved, and placed, FIG. 7 may be repeated starting at block 702.

Thus, FIG. 7 provides a technique that may establish which calibration acceleration profile of a plurality of calibration acceleration profiles produces relative slip between a semiconductor wafer and an end effector that supports the semiconductor wafer that is below a desired threshold when the end effector is moved by a motor according to the calibration acceleration profile. In this technique, once a calibration acceleration profile is determined to produce relative slip that is below the desired threshold, then an operational acceleration profile associated with that calibration acceleration profile may be selected and the end effector may be moved by the motor according to that operational acceleration profile for one or more semiconductor wafers. Thus, a single calibration operation, e.g., blocks 703 through 706/708, may be used to select an operational acceleration profile that may be used for transporting multiple semiconductor wafers. The number of semiconductor wafers that may be transported according to this operational acceleration profile may, for example, be selected based on a number of factors. For example, one factor may be the total number of wafers transported since the most recent calibration operation, e.g., the technique may involve recalibrating every 100 wafers moved. In another example, a group of semiconductor wafers may all be made of the same material and have been exposed to the same processing—such semiconductor wafers may thus be presumed to have similar material and surface properties and thus likely have similar propensities for slip. In such an example, a new calibration may be performed each time a new batch of semiconductor wafers is transported using the end effector (assuming each batch is composed of similar wafers). The technique may thus be thought of as a closed-loop technique with respect to selecting the operational acceleration profile and as an open-loop technique with respect to actual wafer transport. Other techniques are discussed further below.

Figure 8:
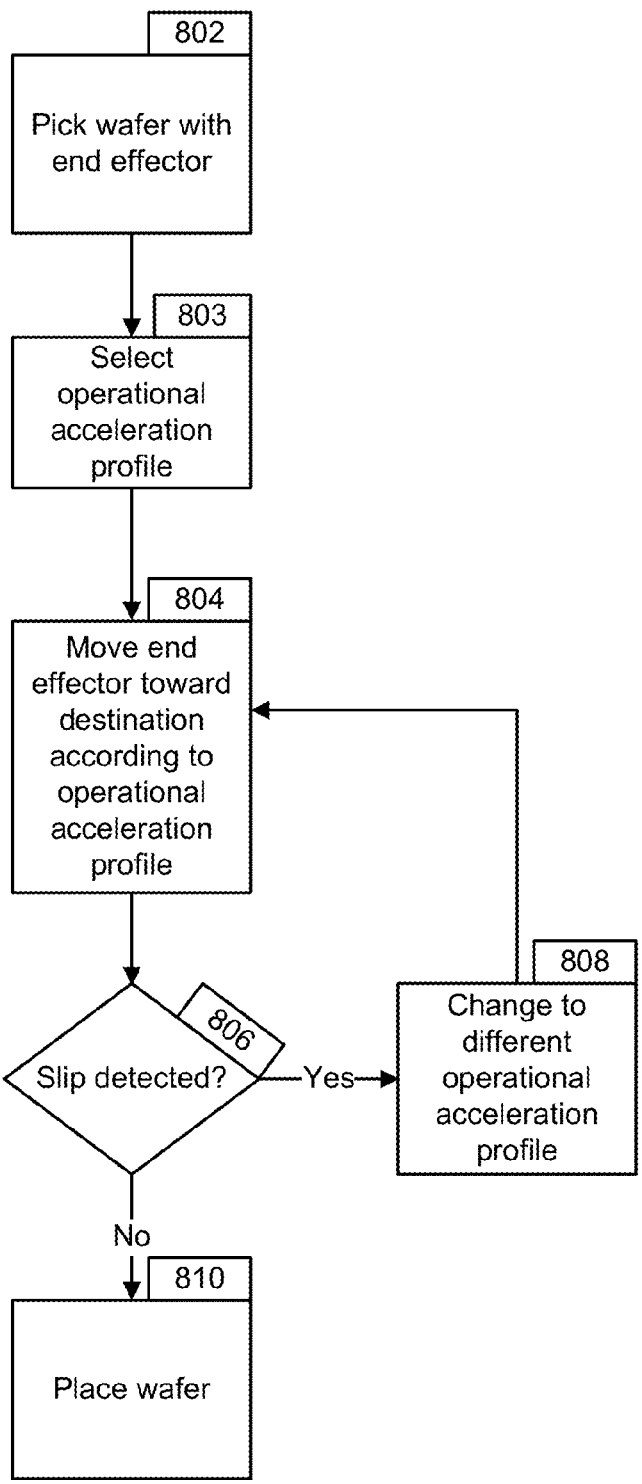
FIG. 8 shows a flow diagram detailing an example technique for real-time wafer handling traction control.

FIG. 8 shows a flow diagram detailing an example technique for real-time wafer handling traction control.

The technique may begin in block 802, where the semiconductor wafer may be picked by the end effector such that the semiconductor wafer rests on, and is supported by, the end effector as detailed in block 702.

In block 803, an operational acceleration profile is selected.

In block 804, the motor moves the robot arm, with the end effector supporting the semiconductor wafer, towards a destination according to the operational acceleration profile.

In block 806, a determination may be made as to whether there is slip of the semiconductor wafer past a threshold amount. In block 806, the sensor may monitor the relative motion of the semiconductor wafer with respect to the end effector similar and output relative motion data to the controller similar to block 706. Slip may be detected if the first motion data derived from the relative motion data exceeds a first threshold motion metric.

If, in block 806, there is detected slip of the semiconductor wafer past the threshold amount, a new operational acceleration profile may be selected. The controller may select a new operational acceleration profile that may exert a lower peak force on the semiconductor wafer, such as through a lower peak acceleration, than the operational acceleration profile that produced slip of the semiconductor wafer past the threshold amount. The technique may then return to block 804, where the robot arm may be moved according to the newly-selected operational acceleration profile.

If no slip of the semiconductor wafer past the threshold amount is detected in block 806, then the robot arm with the end effector may be moved to the destination by the motor in block 810 according to the operational acceleration profile selected in block 804. After the end effector reaches the destination, the end effector may place the semiconductor wafer in the destination, in a manner similar to how the end effector places the semiconductor wafer in block 712. In certain implementations, the orientation and or positioning of the semiconductor wafer may be adjusted after the semiconductor wafer has been placed in the destination. The orientation of the semiconductor wafer may be detected through the sensor 108 or through other sensors mounted in the semiconductor tool. The orientation or positioning of the semiconductor wafer may be adjusted by pre-aligners or automatic wafer centering ("AWC") dynamic aligners with the aid of the sensors.

Thus, FIG. 8 provides a technique where the controller may determine a new operational profile during the transport of semiconductor wafers if relative slip above the desired threshold is detected when transporting the semiconductor wafers according to a previously determined operational acceleration profile. The technique may thus be thought of as an open-loop technique with respect to selecting the initial operational acceleration profile and a closed-loop technique with respect to transporting the actual semiconductor wafer. Other techniques are discussed further below.

Figure 9:
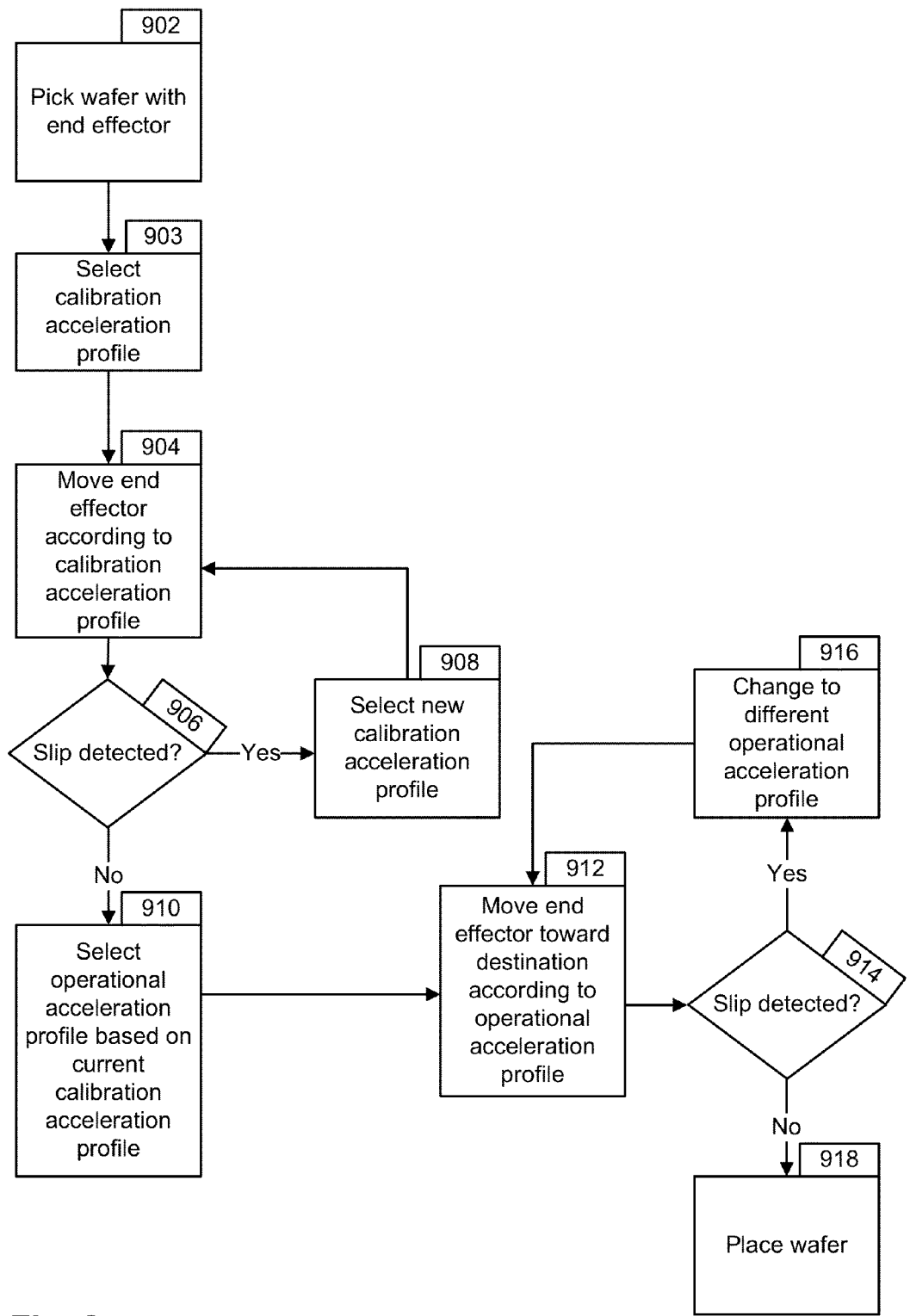
FIG. 9 shows a flow diagram detailing an example of a technique combining slip threshold detection wafer handling traction control using calibration acceleration profiles combined with real-time detection wafer handling traction control.

FIG. 9 shows a flow diagram detailing an example of a technique combining slip threshold detection wafer handling traction control using calibration acceleration profiles combined with real-time detection wafer handling traction control. The semiconductor wafer handling utilizing a wafer handling traction control detailed in FIG. 9 is a combination of the semiconductor wafer handling techniques detailed in FIG. 7 and FIG. 8.

The technique may begin in block 902, where the semiconductor wafer may be picked by the end effector in a similar manner to that described in block 702.

In block 903, a calibration acceleration profile is selected. The calibration acceleration profiles and operational acceleration profiles described in FIG. 9 are similar in manner to the calibration acceleration profiles and operational acceleration profiles described with reference to FIGS. 7 and 8.

In block 904, the robot arm and the end effector are moved by the motor according to the calibration acceleration profile.

In block 906, a determination may be made as to whether there is slip of the semiconductor wafer past a threshold amount. In block 906, the sensor may monitor the relative motion of the semiconductor wafer with respect to the end effector and output the relative motion data to the controller. Slip may be detected by the controller similar to block 706.

If, in block 906, there is slip detected of the semiconductor wafer past the threshold amount, a new calibration acceleration profile may be selected, as detailed in block 908. The controller may select a new calibration acceleration profile in the same manner as that detailed in block 708. The technique may then return to block 904, where the robot arm may be moved according to the newly-selected calibration acceleration profile.

If no slip of the semiconductor wafer past the threshold amount is detected in block 906, then the operational acceleration profile corresponding to the calibration acceleration profile may be selected in block 910.

In block 912, the motor moves the robot arm with the end effector supporting the semiconductor wafer towards the destination according to the operational acceleration profile selected in block 710.

In block 914, a determination may be made as to whether there is slip of the semiconductor wafer past a threshold amount. In block 914, the sensor may monitor the relative motion of the semiconductor wafer with respect to the end effector and output the relative motion data to the controller similar to block 806. Slip may be detected by the controller similar to block 806.

If, in block 914, there is detected slip of the semiconductor wafer past the threshold amount, a new operational acceleration profile may be selected. The controller may select a new operational acceleration profile that may exert a lower peak force on the semiconductor wafer, such as through a lower peak acceleration, than the operational acceleration profile that produced slip of the semiconductor wafer past the threshold amount. The technique may then return to block 912, where the robot arm may be moved according to the newly-selected operational acceleration profile.

If no slip of the semiconductor wafer past the threshold amount is detected in block 914, then the robot arm with the end effector may be moved by the motor to the destination in block 918 according to the operational acceleration profile selected. After the end effector reaches the destination, the end effector may place the semiconductor wafer in the destination, in a manner similar to how the end effector places the semiconductor wafer in block 712. In certain implementations, the orientation and or positioning of the semiconductor wafer may be adjusted after the semiconductor wafer has been placed in the destination as in block 712.

Thus, FIG. 9 provides a technique that may establish which calibration acceleration profile of a plurality of calibration acceleration profiles produces relative slip between a semiconductor wafer and an end effector that supports the semiconductor wafer that is below a desired threshold when the end effector is moved by a motor according to the calibration acceleration profile. FIG. 9 also provides a technique that may determine a new operational acceleration profile if relative slip above the desired threshold is detected when transporting the semiconductor wafer according to the previously determined operational acceleration profile. In this technique, each semiconductor wafer transported has a calibration acceleration profile and an operational acceleration profile determined. The technique may thus be thought of as a closed-loop technique with respect to selecting the operational acceleration profile and transporting the actual semiconductor wafer. In some implementations, blocks 903 through 910 may be performed for a subset of wafers in a common batch of wafers, e.g., the first wafer in the batch, and the operational profile that is selected in block 910 for that first wafer may also be used for the remaining wafers in the batch without repeating blocks 903 through 910 for the remaining wafers in the batch.

Figure 10A:
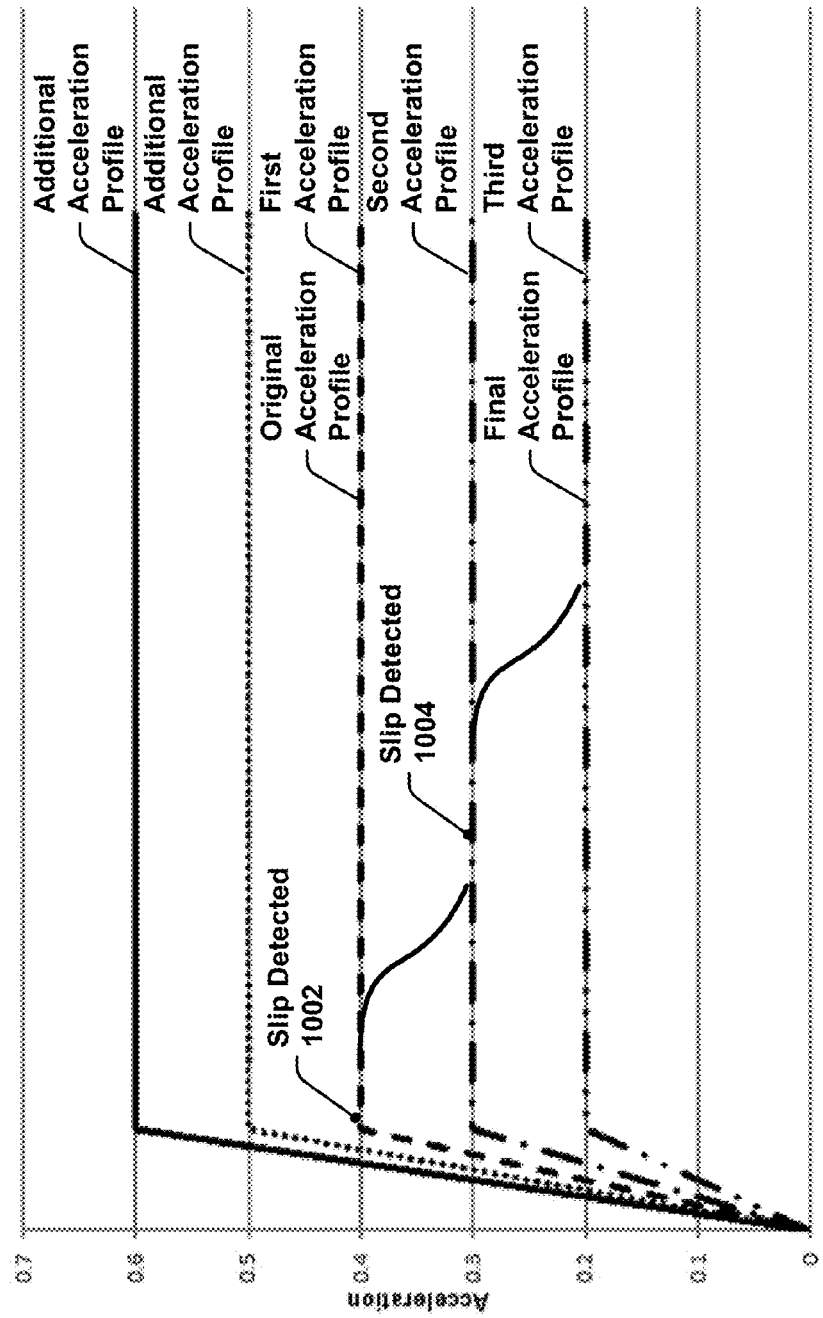
FIG. 10A is a graph showing example partial acceleration profiles and an example of determining a final acceleration profile from an original acceleration profile.

FIG. 10A is a graph showing example partial acceleration profiles and an example of determining a final acceleration profile from an original acceleration profile. FIG. 10A shows five different example partial acceleration profiles. In the implementation in FIG. 10A, the example acceleration profiles are previously programmed into the memory of the controller. The example partial acceleration profiles in FIG. 10A are example partial operational acceleration profiles. A technique similar to the technique detailed in FIG. 10A may be applied to calibration acceleration profiles to determine the final calibration acceleration profile.

In FIG. 10A, the controller first selects the original acceleration profile. The original acceleration profile in FIG. 10A is the first acceleration profile. The controller instructs the motor to move the robot arm according to the first acceleration profile. In FIG. 10A, while the robot arm is moved, the sensor may monitor the relative motion of the semiconductor wafer with respect to the end effector and output the sensor data to the controller in a manner similar to the manner described in FIG. 1. The controller may derive a first motion data from the relative motion data and determine whether the first motion data exceeds the first threshold motion metric.

In FIG. 10A, the controller determines at point 1002 that the first motion data of the movement of the robot arm according to the first acceleration profile exceeds the first threshold motion metric. The controller then selects the second acceleration profile and instructs the motor to move the robot arm according to the second acceleration profile. The second acceleration profile has a lower maximum acceleration than the first acceleration profile. Movement of the robot arm according to the second acceleration profile is configured to result in a lower peak force exerted on the semiconductor wafer than movement of the robot arm according to the first acceleration profile.

After the second acceleration profile is selected, the controller in FIG. 10A then determines at point 1004 that the first motion data of movement of the robot arm according to the second acceleration profile exceeds the first threshold motion metric. The controller then selects the third acceleration profile and instructs the motor to move the robot arm according to the third acceleration profile. In FIG. 10A, the third acceleration profile has the lowest maximum acceleration. Movement of the robot arm according to the third acceleration profile is configured to result in the lowest peak force exerted on the semiconductor of any acceleration profile in FIG. 10A. In FIG. 10A, movement of the robot arm according to the third acceleration profile results in a first motion data lower than the first threshold motion metric. Thus, the controller continues instructing the motor to move the robot arm according to the third acceleration profile until the end effector reaches the destination.

In certain implementations, if movement of the robot arm according to the lowest available acceleration profile results in a first motion data exceeding the first threshold motion metric, then the controller is configured to halt movement of the robot arm. In FIG. 10A, the lowest available acceleration profile is the third acceleration profile.

FIG. 10A has two unused additional acceleration profiles. Movement of the robot arm according to any of the two additional acceleration profiles is configured to result in a higher peak force exerted on the semiconductor wafer than movement of the robot arm according to the first acceleration profile. In certain implementations, the controller may be configured to select one of the two additional acceleration profiles as the original acceleration profile, e.g., the controller may start with the acceleration profile that has the highest peak accelerations and then progress downwards through the available acceleration profiles as needed in response to detected slip.

Figure 10B:
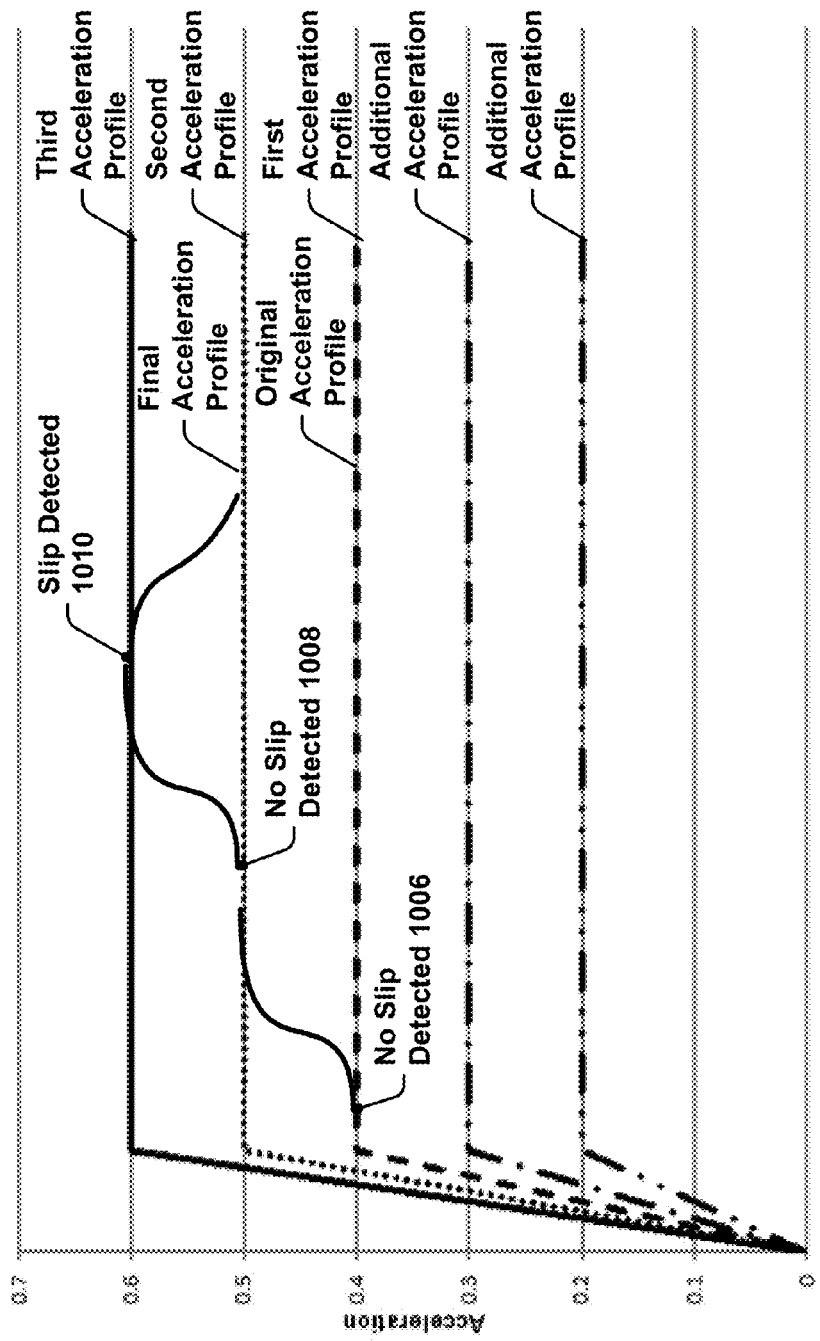
FIG. 10B is another graph showing example partial acceleration profiles and an example of determining a final acceleration profile from an original acceleration profile.
Figure 10C:
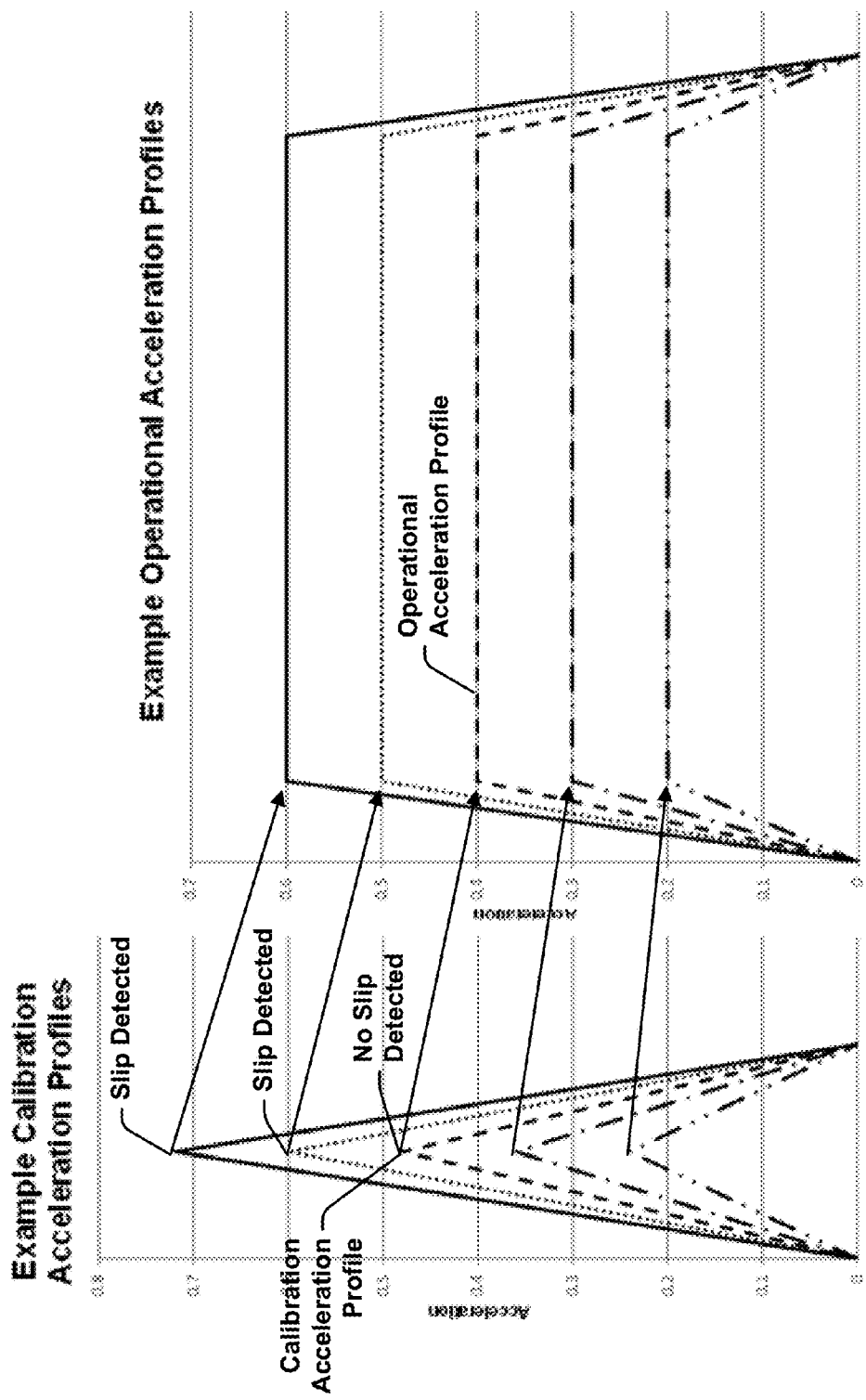
FIG. 10C is a graph showing example partial acceleration profiles that may be used in determining an operational acceleration profile from a calibration acceleration profile.

FIG. 10B is another graph showing example partial acceleration profiles and an example of determining a final acceleration profile from an original acceleration profile. FIG. 10B shows five different example partial acceleration profiles. In the implementation in FIG. 10B, the example acceleration profiles are previously programmed into the memory of the controller. The example partial acceleration profiles in FIG. 10B are example partial operational acceleration profiles. A technique similar to the technique detailed in FIG. 10B may be applied to calibration acceleration profiles to determine the final calibration acceleration profile.

In FIG. 10B, the controller first selects the original acceleration profile. The original acceleration profile in FIG. 10A is the first acceleration profile and is similar to the first acceleration profile in FIG. 10A. The controller instructs the motor to move the robot arm according to the first acceleration profile. While the robot arm is moved, the sensor may monitor the relative motion of the semiconductor wafer with respect to the end effector in a manner and output the relative motion data similar to FIG. 10A. The controller may derive a first motion data from the relative motion data and determine whether the first motion data exceeds the first threshold motion metric.

In FIG. 10B, the controller determines at point 1006 that the first motion data of movement of the robot arm according to the first acceleration profile is lower than the first threshold motion metric. The controller then selects the second acceleration profile and instructs the motor to move the robot arm according to the second acceleration profile. The second acceleration profile has a higher maximum acceleration than the first acceleration profile. Movement of the robot arm according to the second acceleration profile is configured to result in a higher peak force exerted on the semiconductor wafer than movement of the robot arm according to the first acceleration profile.

After the second acceleration profile is selected, the controller in FIG. 10B then determines at point 1008 that the first motion data of movement of the robot arm according to the second acceleration profile is lower than the first threshold motion metric. The controller then selects the third acceleration profile and instructs the motor to move the robot arm according to the third acceleration profile. The third acceleration profile has the highest maximum acceleration. Movement of the robot arm according to the third acceleration profile is configured to result in the highest peak force exerted on the semiconductor wafer of any acceleration profile in FIG. 10B.

After the third acceleration profile is selected, the controller in FIG. 10B then determines at point 1010 that the first motion data of movement of the robot arm according to the third acceleration profile exceeds the first threshold motion metric. The controller then reselects the second acceleration profile and instructs the motor to move the robot arm according to the second acceleration profile. The movement of the robot arm according to the second acceleration profile results in a first motion data lower than the first threshold motion metric. Thus, the controller continues instructing the motor to move the robot arm according to the second acceleration profile until the end effector reaches the destination.

In FIG. 10B, there are two unused additional acceleration profiles. Movement of the robot arm according to any of the two additional acceleration profiles is configured to result in a lower peak force exerted on the semiconductor wafer than movement of the robot arm according to the first acceleration profile. The controller in FIG. 10B may be configured to select one of the two additional acceleration profiles if the first motion data of movement of the end effector according to the first acceleration profile exceeds the first threshold motion metric.

FIG. 10C is a graph showing example partial acceleration profiles and an example of the process of determining an operational acceleration profile from a calibration acceleration profile.

In FIG. 10C, each example calibration acceleration profile has a corresponding example operational acceleration profile. The arrows show which example operational acceleration profile corresponds to which example calibration acceleration profile. The example calibration acceleration profiles all have acceleration higher than their corresponding example operational acceleration profile. Example operational acceleration profiles accelerate at a lower rate than their corresponding example calibration acceleration profiles to allow for a safety margin when semiconductor wafers are actually handled and transported from station to station.

In the implementation in FIG. 10C, the controller first determines the calibration acceleration profile. The controller determines the calibration acceleration profile by determining which example calibration acceleration profile has a resulting first motion data lower than the first threshold motion metric as in blocks 702 to 708 of FIG. 7. After the controller determines the calibration acceleration profile, the controller then selects the corresponding operational acceleration profile as in block 710 of FIG. 7.

What is claimed is:

1. An apparatus comprising:
    a first robot arm configured to support a first semiconductor wafer on a first end effector;
    a first optical sensor configured to detect relative movement between the first semiconductor wafer and the first end effector; and
    a controller with one or more processors and a memory, wherein the one or more processors, the memory, the first robotic arm, and the first optical sensor are communicatively connected and the memory stores program instructions for controlling the one or more processors to:
        a) cause the first robot arm to move according to a first acceleration profile while the first semiconductor wafer is supported by the first end effector,
        b) receive first optical sensor data from the first optical sensor,
        c) analyze at least the first optical sensor data to determine first motion data based on relative movement of the first semiconductor wafer with respect to the first end effector during motion of the first robot arm while the first semiconductor wafer is supported by the first end effector,
        d) determine whether the first motion data attributable to movement of the first robot arm according to the first acceleration profile exceeds a first threshold motion metric, and
        e) cause the first robot arm to move according to a second acceleration profile when the first motion data attributable to movement of the first robot arm according to the first acceleration profile exceeds the first threshold motion metric, wherein the first motion data attributable to movement of the first robot arm according to the second acceleration profile stays within the first threshold motion metric.

2. The apparatus of claim 1, wherein the first robot arm supports the first optical sensor.

3. The apparatus of claim 1, wherein the first optical sensor is supported in a location that is fixed with respect to the first robot arm.

4. The apparatus of claim 1, wherein the first optical sensor is configured to interact with a pattern on the first semiconductor wafer.

5. The apparatus of claim 1, further comprising a second sensor configured to detect relative movement between the first semiconductor wafer and the first end effector, wherein the memory further stores program instructions for controlling the one or more processors to:
    receive second sensor data from the second sensor, and
    analyze at least the first optical sensor data and the second sensor data to determine the first motion data.

6. The apparatus of claim 5, wherein the first robot arm supports the first optical sensor and the second sensor.

7. The apparatus of claim 5, wherein the second sensor is an optical sensor.

8. The apparatus of claim 7, wherein the second sensor is configured to interact with a pattern on the first semiconductor wafer.

9. The apparatus of claim 5, wherein the first robot arm supports the first optical sensor and the second sensor is supported in a location that is fixed with respect to the first robot arm.

10. The apparatus of claim 5, wherein the second sensor is selected from the group consisting of a machine vision sensor, a laser sensor, a dual laser sensor, a photo based sensor, a machine imaging sensor, a charge coupled device, a broken beam sensor, an accelerometer, ultrasonic sensor, and a mechanical sensor.

11. The apparatus of claim 1, wherein the first optical sensor is selected from the group consisting of a machine vision sensor, a laser sensor, a dual laser sensor, a photon based sensor, a machine imaging sensor, a charge coupled device, and a broken beam sensor.

12. The apparatus of claim 1, wherein the first optical sensor is a laser sensor.

13. The apparatus of claim 1, wherein the first motion data is based on data from which the relative angle of rotation of the first semiconductor wafer with respect to the first end effector during motion of the first robot arm while the first semiconductor wafer is supported by the first end effector can be calculated.

14. The apparatus of claim 1, wherein the first motion data is based on a combination of two or more relative motion parameters selected from the group consisting of:
    relative acceleration of the first semiconductor wafer with respect to the first end effector during motion of the first robot arm while the first semiconductor wafer is supported by the first end effector;
    relative velocity of the first semiconductor wafer with respect to the first end effector during motion of the first robot arm while the first semiconductor wafer is supported by the first end effector;
    relative displacement of the first semiconductor wafer with respect to the first end effector during motion of the first robot arm while the first semiconductor wafer is supported by the first end effector; and relative angle of rotation of the first semiconductor wafer with respect to the first end effector during motion of the first robot arm while the first semiconductor wafer is supported by the first end effector can be calculated.

15. A method comprising:
a) moving a first robot arm, including a first end effector supporting a first semiconductor wafer, according to a first calibration acceleration profile;
b) receiving first optical sensor data from a first optical sensor configured to detect relative movement between the first semiconductor wafer and the first end effector;
c) analyzing the first optical sensor data to determine first motion data based on relative movement of the first semiconductor wafer with respect to the first end effector during motion of the first robot arm while the first semiconductor wafer is supported by the first end effector; and
d) determining whether the first motion data attributable to movement of the first robot arm according to the first calibration acceleration profile exceeds a first threshold motion metric.

16. The method of claim 15, further comprising:
e) determining that the first motion data attributable to movement of the first robot arm according to the first calibration acceleration profile exceeds the first threshold motion metric;
f) moving the first robot arm, including the first end effector supporting the first semiconductor wafer, according to a second calibration acceleration profile;
g) determining that the first motion data attributable to movement of the first robot arm according to the second calibration acceleration profile does not exceed the first threshold motion metric;
h) selecting a second operational acceleration profile associated with the second calibration acceleration profile;
i) moving the first robot arm, after h), according to the second operational acceleration profile associated with the second calibration acceleration profile;
j) determining, after i), whether the first motion data attributable to the movement of the first robot arm according to the second operational acceleration profile exceeds a second threshold motion metric;
k) determining, after j), that the first motion data attributable to the movement of the first robot arm according to the second operational acceleration profile exceeds the second threshold motion metric;
l) selecting, after k), a third operational acceleration profile; and
m) moving, after l), the first robot arm according to the third operational acceleration profile, wherein the first motion data attributable to the movement of the first robot arm according to the third operational acceleration profile stays within the second threshold motion metric; and
n) determining, after m), that the first motion data attributable to the movement of the first robot arm according to the third operational acceleration profile does not exceed the second threshold motion metric.

17. The method of claim 15, further comprising:
e) determining that the first motion data attributable to movement of the first robot arm according to the first calibration acceleration profile does not exceed the first threshold motion metric;
f) selecting a first operational acceleration profile associated with the first calibration acceleration profile;
g) moving the first robot arm, after f), according to the first operational acceleration profile associated with the first calibration acceleration profile;
h) determining, after g), whether the first motion data attributable to the movement of the first robot arm according to the first operational acceleration profile exceeds a second threshold motion metric;
i) determining, after h), that the first motion data attributable to the movement of the first robot arm according to the first operational acceleration profile exceeds the second threshold motion metric;
j) selecting, after i), a third operational acceleration profile;
k) moving, after j), the first robot arm according to the third operational acceleration profile wherein the first motion data attributable to the movement of the first robot arm according to the third operational acceleration profile stays within the second threshold motion metric; and
l) determining, after k), that the first motion data attributable to the movement of the first robot arm according to the third operational acceleration profile does not exceed the second threshold motion metric.

18. The method of claim 15, further comprising:
e) determining that the first motion data attributable to movement of the first robot arm according to the first calibration acceleration profile does not exceed the first threshold motion metric;
f) selecting a first operational acceleration profile associated with the first calibration acceleration profile; and
g) moving the first robot arm N additional times according to the first operational acceleration profile for N additional semiconductor wafers when the first motion data attributable to the movement of the first robot arm according to the first operational acceleration profile exceeds the first threshold motion metric and the first motion data attributable to the movement of the first robot arm according to the first operational acceleration profile does not exceed the first threshold motion metric, wherein N is an integer greater than or equal to 1.

19. The method of claim 15, further comprising:
e) determining that the first motion data attributable to movement of the first robot arm according to the first calibration acceleration profile does not exceed the first threshold motion metric;
f) selecting a third calibration acceleration profile;
g) moving, after f), the first robot arm according to the third calibration acceleration profile;
h) determining, after g), that the first motion data attributable to movement of the first robot arm according to the third calibration acceleration profile does not exceed the first threshold motion metric;
i) selecting, after h), a third operational acceleration profile associated with the third calibration acceleration profile;
j) moving, after i), the first robotic arm according to the third operational acceleration profile associated with the third calibration acceleration profile; and
k) determining, after j), that the first motion data attributable to movement of the first robot arm according to the third operational acceleration profile does not exceed the first threshold motion metric.

20. The method of claim 15, wherein the first optical sensor is selected from the group consisting of a machine vision sensor, a laser sensor, a dual laser sensor, a photon based sensor, a machine imaging sensor, a charge coupled device, and a broken beam sensor.

* * * * *